(12) United States Patent
Iga et al.

(10) Patent No.: US 7,888,247 B2
(45) Date of Patent: Feb. 15, 2011

(54) METHOD OF FORMING POLYCRYSTALLINE SEMICONDUCTOR FILM

(75) Inventors: Daisuke Iga, Chofu (JP); Yukio Taniguchi, Matsudo (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 241 days.

(21) Appl. No.: 12/133,635

(22) Filed: Jun. 5, 2008

(65) Prior Publication Data

US 2008/0305618 A1 Dec. 11, 2008

(30) Foreign Application Priority Data

Jun. 7, 2007 (JP) ............................. 2007-151158

(51) Int. Cl.
*H01L 21/20* (2006.01)
*H01L 21/36* (2006.01)
(52) U.S. Cl. .................. 438/487; 438/479; 438/486
(58) Field of Classification Search ............... 438/479, 438/486–487

See application file for complete search history.

(56) References Cited

U.S. PATENT DOCUMENTS

2006/0009016 A1* 1/2006 Yamazaki et al. ........... 438/487

FOREIGN PATENT DOCUMENTS

JP 2000-306859 11/2000

* cited by examiner

*Primary Examiner*—Ha Tran T Nguyen
*Assistant Examiner*—Valerie Brown
(74) *Attorney, Agent, or Firm*—Oblon, Spivak,McClelland, Maier & Neustadt, L.L.P.

(57) ABSTRACT

A method of forming a polycrystalline semiconductor film, which includes irradiating an amorphous semiconductor film formed on an insulating substrate with light to convert the amorphous semiconductor into a polycrystalline semiconductor with laterally grown crystal grains, thus forming a polycrystalline semiconductor film, wherein crystal growth in the semiconductor is controlled such that first crystal grains laterally grow in the first direction along a X-axis from the first group of initial nuclei, the second crystal grains laterally grow in the second direction opposite to the first direction along the X-axis from the second group of initial nuclei arranged apart from the first group of initial nuclei along the X-axis, and the first crystal grains collide against the second crystal grains at different points in time along a Y-axis.

14 Claims, 18 Drawing Sheets

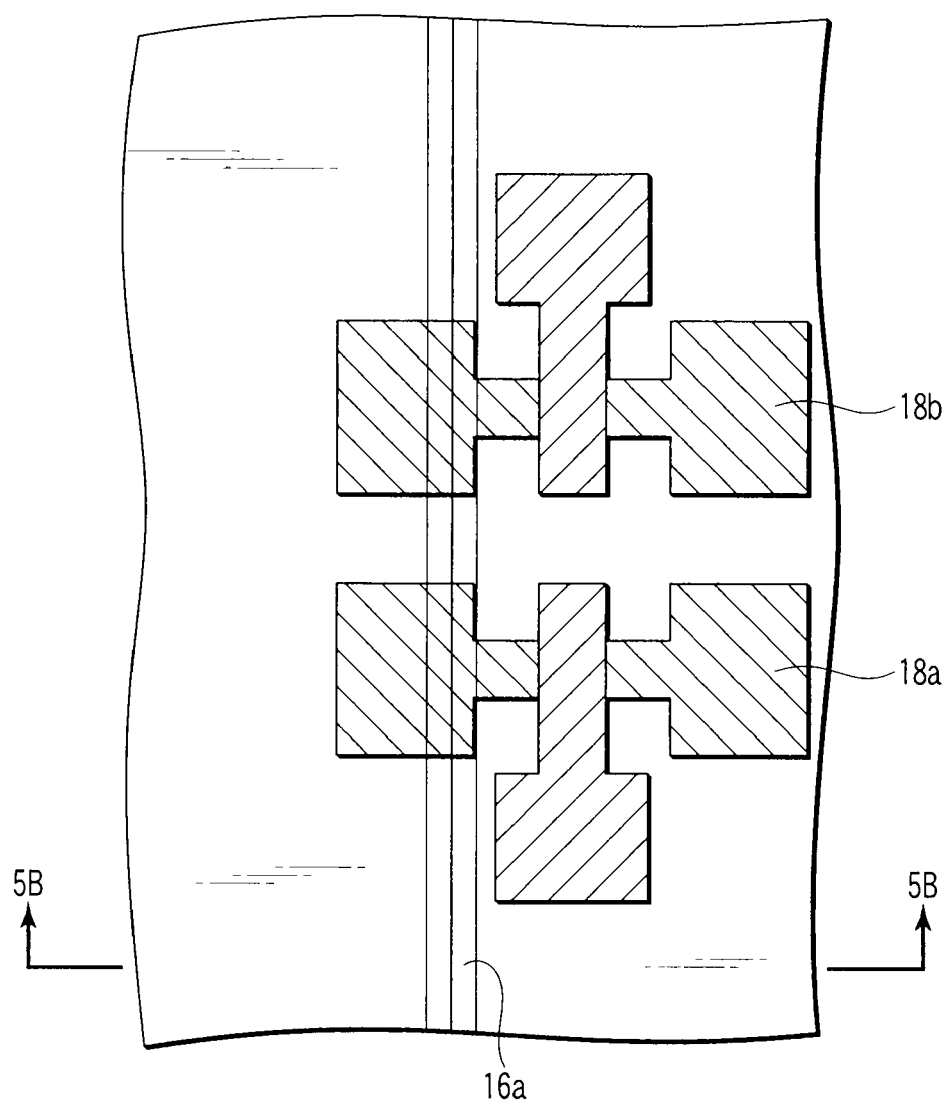
F I G. 5A
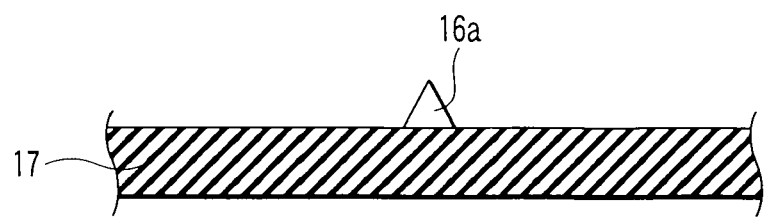
F I G. 5B

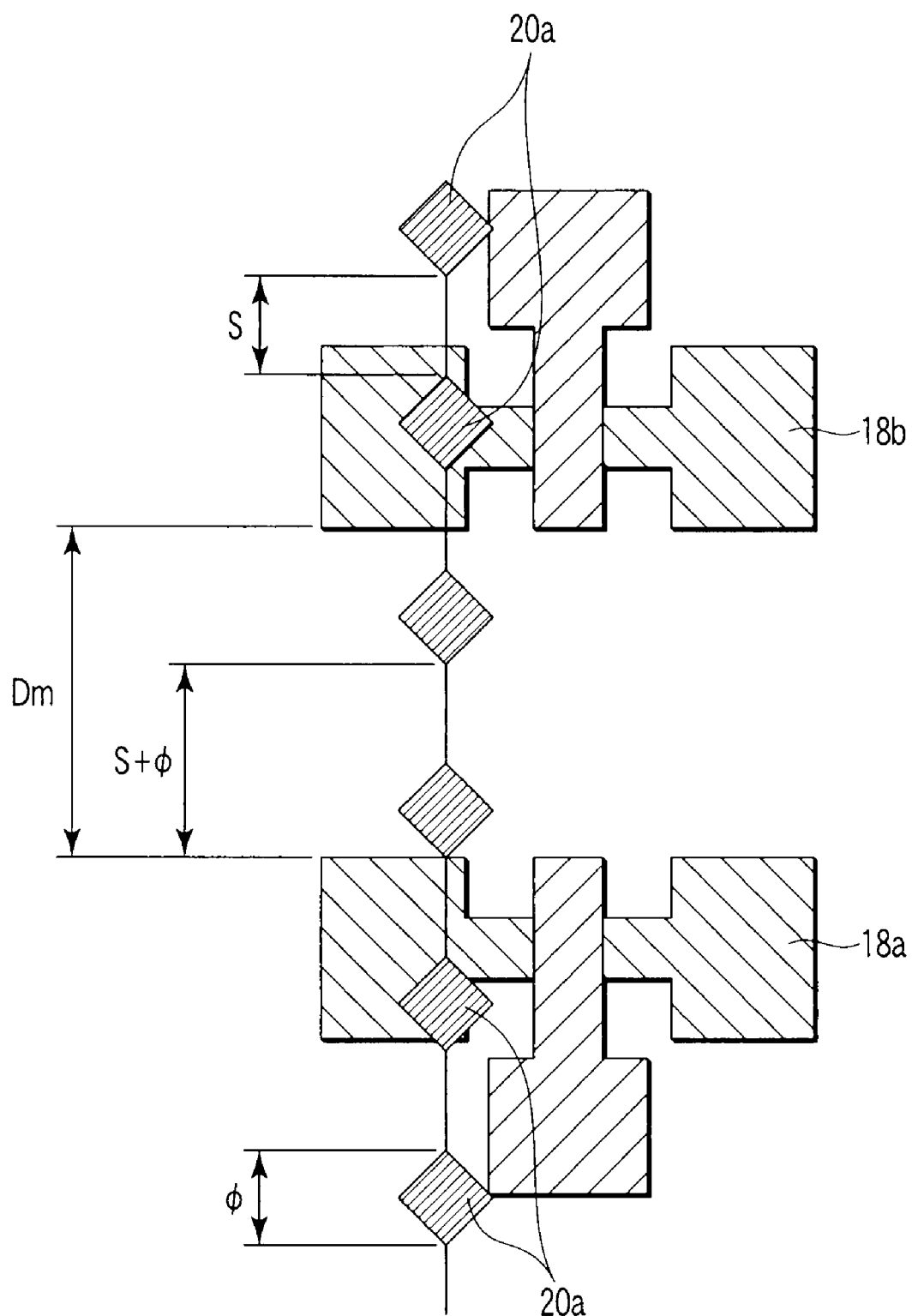
F I G. 16

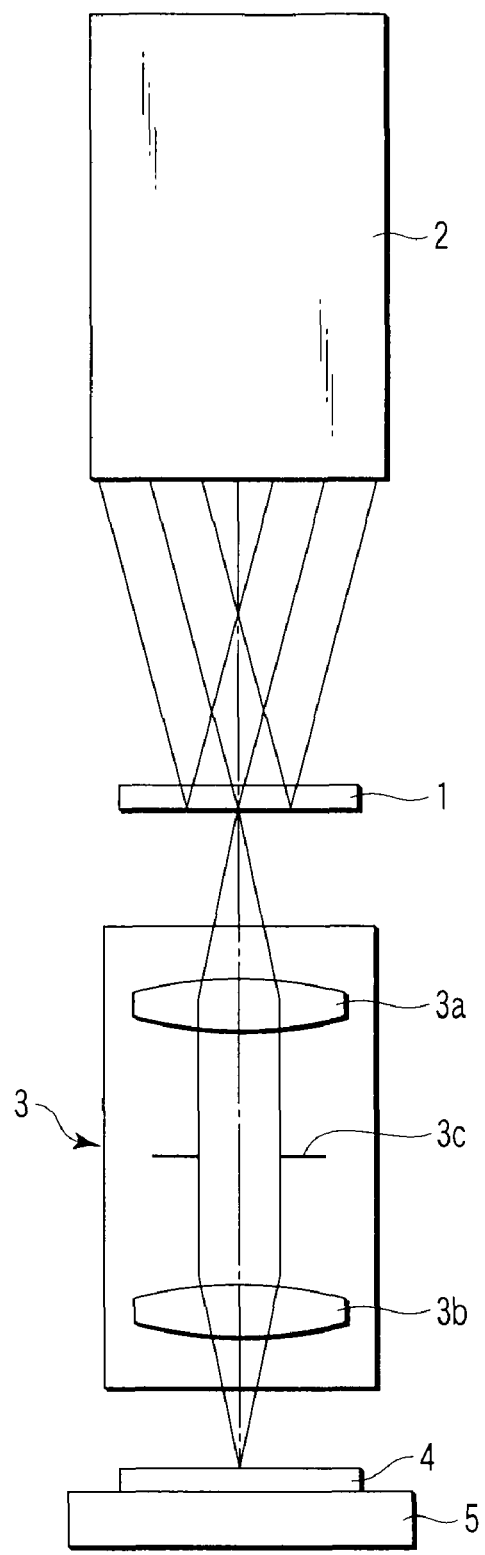
F I G. 17

METHOD OF FORMING POLYCRYSTALLINE SEMICONDUCTOR FILM

CROSS-REFERENCE TO RELATED APPLICATIONS

This application is based upon and claims the benefit of priority from prior Japanese Patent Application No. 2007-151158, filed Jun. 7, 2007, the entire contents of which are incorporated herein by reference.

BACKGROUND OF THE INVENTION

1. Field of the Invention

The present invention relates to a method of forming a polycrystalline semiconductor film, and in particular, to a method of forming a polycrystalline semiconductor thin film serving as an active layer for a thin-film transistor.

2. Description of the Related Art

As a material for fabricating semiconductor devices which exhibit performance comparable to that of fabricated with single-crystal silicon (generally single-crystal semiconductors) on insulating substrates such as glass, polycrystalline silicon thin films (generally polycrystalline semiconductor thin films) formed by laser annealing technique have been used. To form such polycrystalline silicon thin films, a method has been invented which irradiates an amorphous silicon thin film (generally amorphous semiconductor thin film) with laser light exhibiting a predetermined light intensity distribution. With this method, a poly Si thin film with its grains continuously grown in a predetermined direction can be obtained by melting the amorphous Si once and afterward by controlling the position of the generation of initial nuclei and the timing of the recrystallization.

Various methods of controlling the position and timing of the crystal regrowth have been proposed. One of these methods is a method of recrystallizing a silicon thin film on the basis of phase-modulated excimer laser annealing (PMELA). With PMELA, a phase shift mask (generally a light modulating element) is used to modulate the distribution of the intensity of the incident laser light projected to the amorphous silicon thin film. Specifically, the said distribution of the intensity of the incident laser light is such that the light intensity (irradiation energy) has the minimum value at a desired position on the amorphous silicon thin film and varies monotonously between the position of the minimum value and the position of a maximum value.

Thus, a temperature distribution is generated in the amorphous silicon thin film; the temperature distribution is such that temperature varies monotonously between the position of the minimum light intensity value and the position of the maximum light intensity value. Owing to this temperature distribution, after the amorphous silicon is melted, crystal growth occurs continuously in a direction from where the temperature is the lowest to where the temperature is the highest, a device-grade polycrystalline thin film with continuously grown, large grain polycrystalline silicon, that has the crystallinity comparable to single crystal silicon can be obtained.

As an example of the conventional technique, Jpn. Pat. Appln. KOKAI Publication No. 2000-306859 discloses a method of recrystallization by irradiating a semiconductor film with laser exhibiting intensity distribution with an inverse peak pattern generated via a phase shift mask. With this conventional technique, the grain growth starts from two groups of initial nuclei that each are respectively arranged on one of two parallel lines. The grain growth completes when grains collide against one another at the center of the said two parallel lines. At the point where grains collide against one another, the thickness of the silicon film is increased compared to that of the other areas, forming a linearly continuous hillock, as the result. When such a recrystallized silicon thin film is used to form an active layer for a thin-film transistor (TFT) on an insulating substrate, the said hillock portion of the silicon may cause two adjacent TFTs to be short-circuited.

BRIEF SUMMARY OF THE INVENTION

An object of the present invention is to provide a method of forming a polycrystalline semiconductor film which method can reliably prevent two adjacent TFTs from being short-circuited.

According to the first aspect of the present invention, there is provided a method of forming a polycrystalline semiconductor film, which comprises irradiation of light to an amorphous semiconductor film formed on an insulating substrate to convert the amorphous semiconductor into a polycrystalline semiconductor with comparably large, continuously grown grains, thus forming a polycrystalline semiconductor film, wherein crystal growth is controlled such that, on an X-axis and a Y-axis which are set with respect to a surface of the amorphous semiconductor film and which are orthogonal to each other, first crystal grains crystallinically grow in the first direction along the X-axis from the first group of initial nuclei, the second crystal grains crystallinically grow in the second direction opposite to the first direction along the X-axis from the second group of initial nuclei separately arranged from the first group of initial nuclei along the X-axis, and the first crystal grains collide against the second crystal grains at different points in time along the Y-axis.

According to the second aspect of the present invention, there is provided a method of manufacturing a thin-film semiconductor device, which comprises: forming an amorphous semiconductor film on an insulating substrate; irradiation of light to said amorphous semiconductor film to convert the amorphous semiconductor into a polycrystalline semiconductor with continuously grown crystal grains, thus forming a polycrystalline semiconductor film; and forming a plurality of thin-film transistors each having the polycrystalline semiconductor film as an active layer, wherein during the formation of the polycrystalline semiconductor film, crystal growth is controlled such that, on the X-axis and the Y-axis which are set with respect to a surface of the amorphous semiconductor film and which are orthogonal to each other, first crystal grains crystallinically grow in the first direction along the X-axis from the first group of initial nuclei, the second crystal grains crystallinically grow in the second direction opposite to the first direction along the X-axis from the second group of initial nuclei separately arranged from the first group of initial nuclei along the X-axis, and the first crystal grains collide against the second crystal grains at different points in time along the Y-axis.

According to the third aspect of the present invention, there is provided a thin-film semiconductor device comprising an insulating substrate, a plurality of island-like polycrystalline semiconductor films, the first thin-film transistor and the second thin-film transistor each formed on a corresponding one of at least two of the said plurality of island-like polycrystalline semiconductor films, and a plurality of isolated dot-like nodules generated between the thin-film transistors on the insulating substrate that are formed as the result of the collision between the first group of grains grown along the first direction and the second group of grains grown along the second direction opposite to the first direction.

According to the fourth aspect of the present invention, there is provided a crystallization apparatus which irradiates an amorphous semiconductor film with light to convert the said amorphous semiconductor into a polycrystalline semiconductor, thus forming a polycrystalline semiconductor film, the apparatus comprising a light modulating element which modulates a phase of an incident luminous flux to form a luminous flux having a distribution of a light intensity varying in V shape in the first direction and having a gradient of cyclic increase and decrease in the second direction orthogonal to the first direction, an illumination system which illuminates the light modulating element, and an image forming optical system which forms light from the light modulating element into an image on the amorphous semiconductor film.

According to the fifth aspect of the present invention, there is provided a light modulating element having a basic pattern in which elongate band-like areas containing a plurality of unit areas arranged along the Y-axis and extending along the Y-axis are repeatedly arranged along the X-axis, and in each of the band-like areas, a ratio of the first area having the first phase value to the second area having the second phase value varies with the unit area along the X-axis, and a change rate of an occupied area rate of the first area in each unit area increases and decreases in the Y-axis for each band-like area.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 5A is a plan view schematically showing how the continuous hillock of the semiconductor is formed after the formation of the active layers for TFTs and how it causes short-circuit between two TFTs;

FIG. 5B is a sectional view taken along line D-D in FIG. 5A;

FIG. 16 is a diagram illustrating conditions for reliably preventing the two TFTs from being short-circuited;

FIG. 17 is a diagram schematically showing the configuration of a crystallization apparatus for use in an embodiment of the present invention;

DETAILED DESCRIPTION OF THE INVENTION

Figure 1:
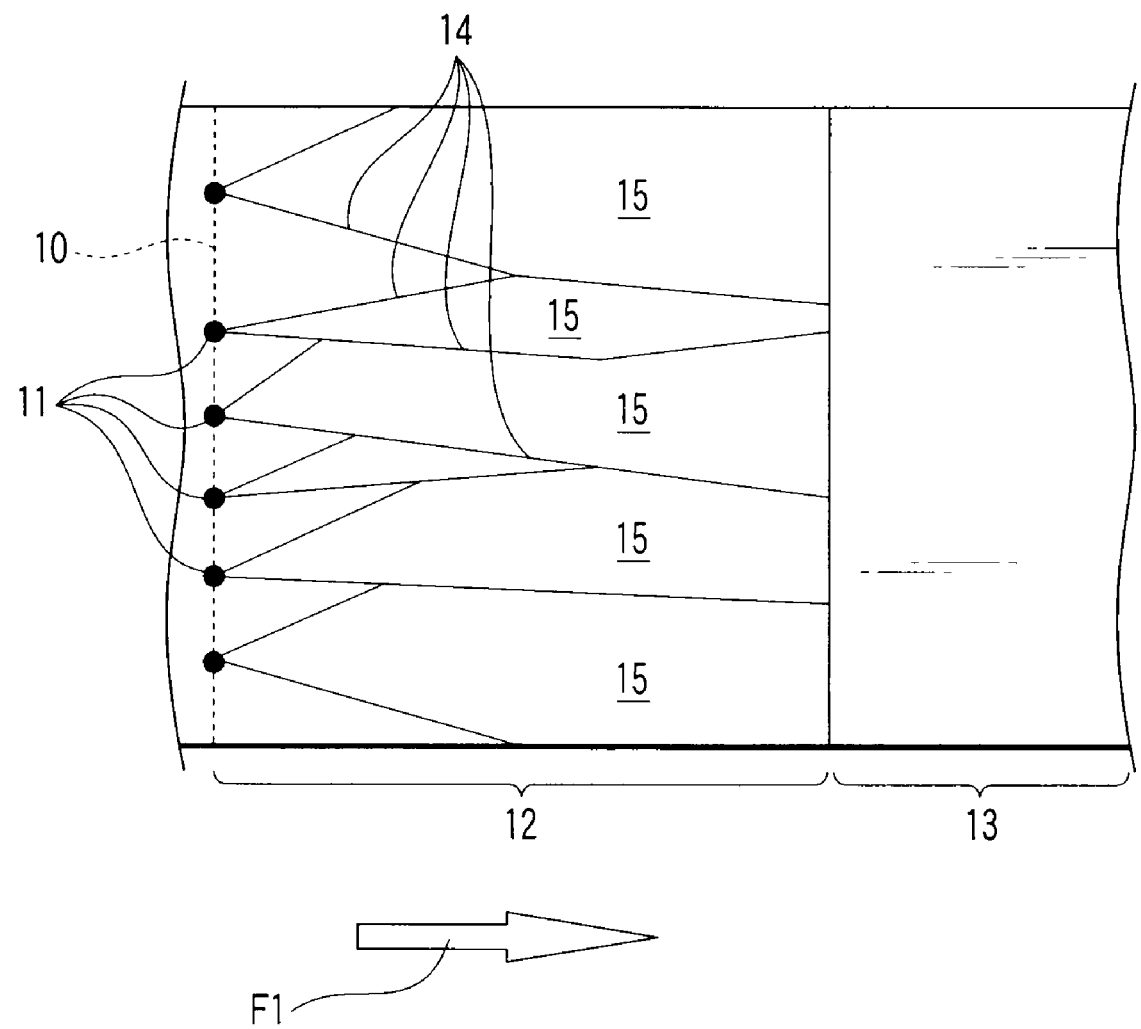
FIG. 1 is a plan view schematically showing how crystal growth progresses in one direction from the initial nuclei generated so as to arranged linearly, as start points of crystal growth.

Various embodiments will be described below in detail.

A method of forming a polycrystalline semiconductor film according to the first aspect of the present invention is characterized in that crystal growth in liquid phase epitaxial manner in a semiconductor is controlled such that, on an X-axis and a Y-axis which are set with respect to a surface of the amorphous semiconductor film and which are orthogonal to each other, the first crystal grains growing in the first direction along the said X-axis from the first group of initial nuclei arranged along the said Y-axis collide against the second crystal grains growing in the second direction opposite to the first direction along the said X-axis from the second group of initial nuclei at the different points in time along the Y-axis.

The above-described method is used to form the polycrystalline semiconductor film in a plurality of thin-film transistors each having the polycrystalline semiconductor film as an active layer. Thus, a thin-film semiconductor device can be obtained.

In this case, two methods are available to control such that the first crystal grains collide against the second crystal grains at the different points in time along the Y-axis.

The first method is to control the crystal growth such that the first group of crystal grains grow in the first direction along the X-axis from the first group of initial nuclei on the first straight line extending along the Y-axis, the second group of crystal grains grow in the second direction opposite to the first direction along the X-axis from the second group of initial nuclei arranged on the second straight line extending along the Y-axis and apart from the first straight line, and growth speeds of the first and second group of crystal grains vary along the Y-axis.

The second method is to control the crystal growth such that the first group of crystal grains grow in the first direction along the X-axis from the first group of initial nuclei arranged at positions in the X-axis direction which vary along the Y-axis, and the second group of crystal grains grow in the second direction opposite to the first direction from the second group of initial nuclei.

According to these methods of forming the polycrystalline semiconductor film, the first and second crystal grains grow along the X-axis and collide against one another. The said first grains collide each other earlier, can not continue growing along the X-axis anymore, thus the direction of the grain growth is rotated 90 degree and the said first grains start growing along the Y-axis. Eventually, the said first grains growing along the said Y-axis and the second grains growing along the said X-axis collide each other from right, left, top and bottom, forming pyramidal or conical nodule.

Thus, when thin-film transistors are formed on a plurality of island-like polycrystalline semiconductor films formed by patterning the polycrystalline semiconductor film, the adjacent thin-film transistors are prevented from being short-circuited by remaining nodules.

The control of the crystal growth according to one of the above-described methods, that is, the first method, can be achieved by irradiating the amorphous semiconductor film with light having a V shape distribution of the intensity along the X-axis and having a gradient increasing and decreasing along the Y-axis. Such light can be formed by a light modulating element.

An available light modulating element has a basic pattern in which elongate band-like areas extending along the Y-axis and containing a plurality of unit areas arranged along the Y-axis are repeatedly arranged along the X-axis orthogonal to the Y-axis. In each of the band-like areas, the ratio of the first area having the first phase value to the second area having the second phase value varies with unit area in the along the X-axis, and the change rate of the occupied area rate of the first area in each unit area increases and decreases along the Y-axis each band-like area.

A crystallization apparatus comprising the above-described light modulating element irradiates the amorphous semiconductor film with light to crystallinically grow the amorphous semiconductor to convert the amorphous semiconductor into a polycrystalline semiconductor, thus forming a polycrystalline semiconductor film. The crystallization apparatus comprises a light modulating element which modulates the phase of an incident luminous flux to form a luminous flux having a distribution of a light intensity varying in V shape along the X-axis and having a gradient increasing and decreasing along the Y-axis orthogonal to the X-axis, an illumination system which illuminates the light modulating element, and an image forming optical system which forms light from the light modulating element into an image on the amorphous semiconductor film.

The above-described methods can provide a thin-film semiconductor device comprising an insulating substrate, a plurality of island-like polycrystalline semiconductor films, the first thin-film transistor and the second thin-film transistor each formed on a corresponding one of at least two of the plurality of polycrystalline semiconductor films, and a plurality of isolated dot-like nodules formed between the thin-film transistors on the insulating substrate and formed as the result of the elevation of the semiconductor film caused by the collision between the grains of polycrystalline semiconductor that are grown along the first direction and the grains of polycrystalline semiconductor that are grown in the second direction, opposite to the first direction.

In this thin-film semiconductor device, the sum of the size φ of each of the dot-like nodules and the distance S between the adjacent dot-like nodules is set smaller than the predetermined minimum distance Dm between pluralities of thin-film transistors. This makes it possible to reliably prevent the plurality of thin-film transistors from being short-circuited through the nodules.

The embodiments of the present invention will be described below in detail. Before the description of the embodiments, description will be given of problems to be solved by the present invention.

For example, with PMELA, as shown in FIG. 1, a group of nuclei 11 is spontaneously generated on a straight line 10 and serves as start points for crystal growth. The grains grow in the direction shown by arrow F1. In FIG. 1, the area denoted by reference number 12 is the area of a polycrystalline semiconductor thin film, converted form the initial amorphous semiconductor film. An area denoted by reference number 13 is the area of an amorphous semiconductor thin film, which is not yet converted to a polycrystalline film. Reference number 14 denotes grain boundaries, and reference number 15 denotes crystal grains partitioned by the said grain boundaries.

Figure 2A:
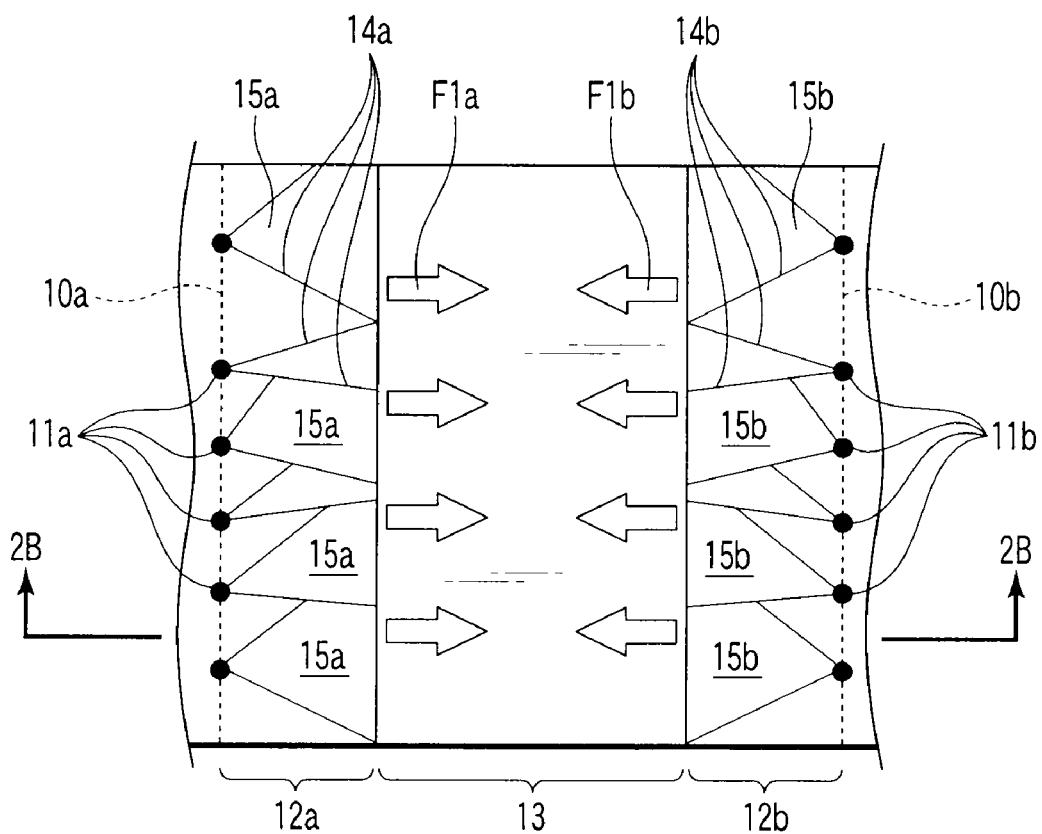
FIG. 2A is a plan view schematically showing how crystals grow in mutually opposite directions from initial nuclei that serve as the starting point of crystal growth, arranged linearly on two specially separated lines parallel to each other.
Figure 2B:
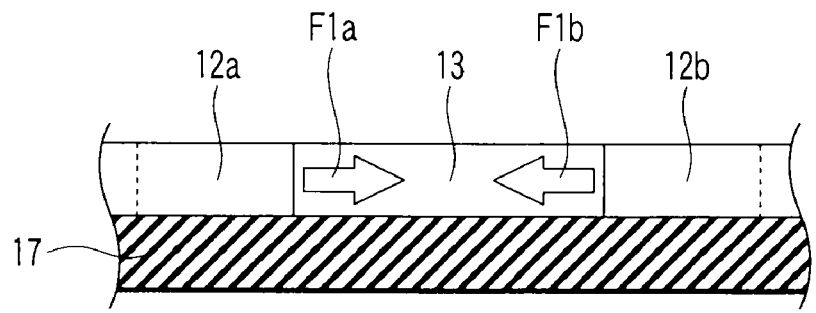
FIG. 2B is a sectional view taken along line A-A in FIG. 2A.

FIG. 2A shows how the grains grow in directions shown by arrows F1$a$ and F1$b$ from the groups of initial nuclei 11$a$ and 11$b$, arranged on two parallel straight lines 10$a$ and 10$b$, respectively. FIG. 2B is a sectional view taken along line A-A in FIG. 2A.

Figure 3A:
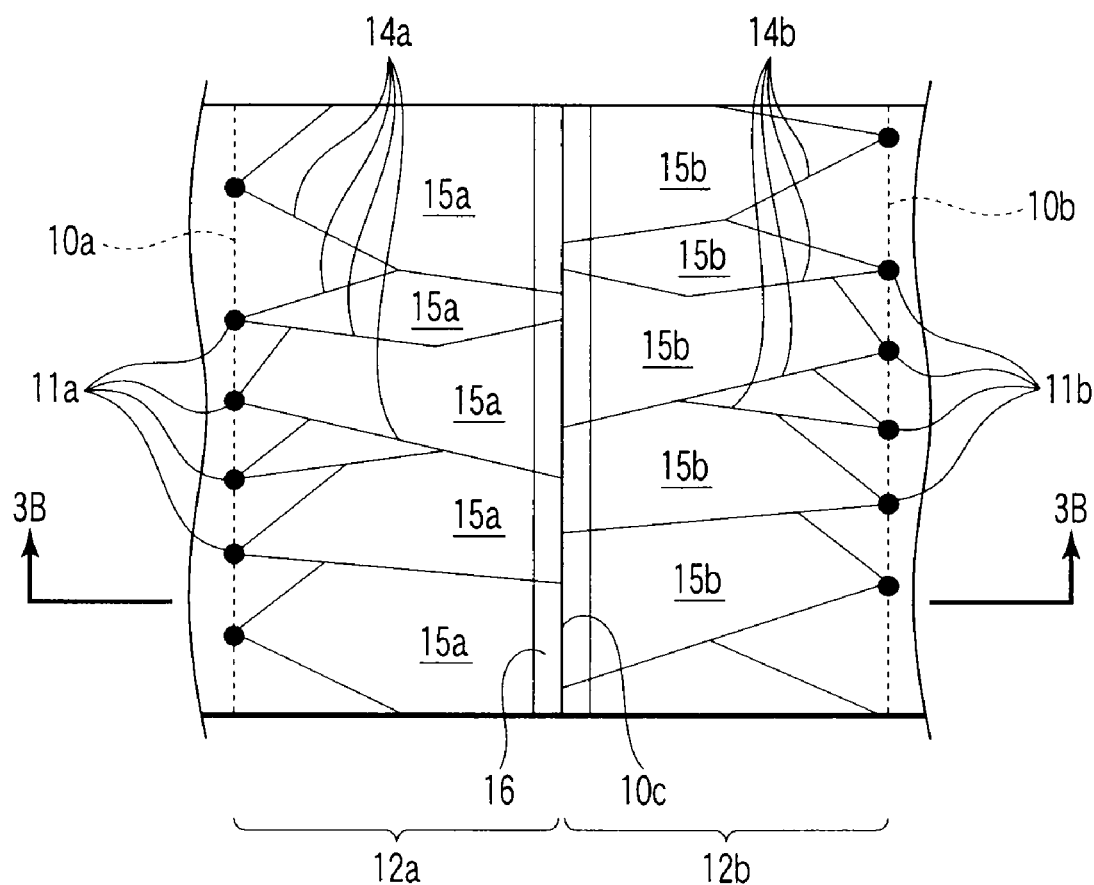
FIG. 3A is a plan view showing the status after the completion of the crystal growth, subsequently to FIGS. 2A and 2B, resulting a linearly continuous hillock at the center of the starting points of the crystal growth arranged parallel to each other.
Figure 3B:
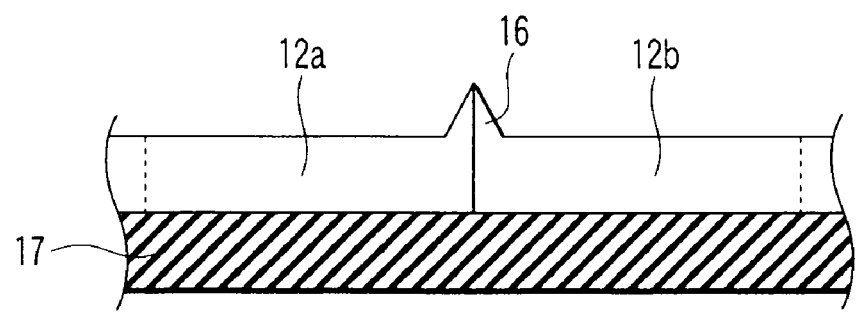
FIG. 3B is a sectional view taken along line B-B in FIG. 3A.

In this case, as shown in FIG. 3A, the formation of polycrystalline film is completed when crystal grains 15a grown in the direction shown by arrow F1a from the group of initial nuclei 11a collide against crystal grains 15b grown in the direction shown by arrow F1b from the group of crystal nuclei 11b, on a straight line denoted 10c positioned midway between the two straight lines 10a and 10b. The thickness of the semiconductor film is increased near the point where the crystal grains 15a collide against the crystal grains 15b. This elevated portion 16 obviously has a thicker film thickness than the other areas. FIG. 3B is a sectional view taken along line B-B in FIG. 3A.

In FIGS. 2A, 2B, 3A, and 3B, areas shown by reference numbers 12a and 12b are the areas of the polycrystalline portion of the semiconductor thin films grown from the groups of the said initial nuclei 11a and 11b. In FIGS. 2A and 2B, the area denoted by reference number 13 is the amorphous portion of the semiconductor thin film, which is not crystallized. In FIGS. 2A, 2B, 3A, and 3B, reference numbers 14a and 14b denote boundaries of grains grown from the groups of nuclei 11a and 11b. Reference number 17 denotes an insulating layer formed on a glass substrate (not shown).

Figure 4A:
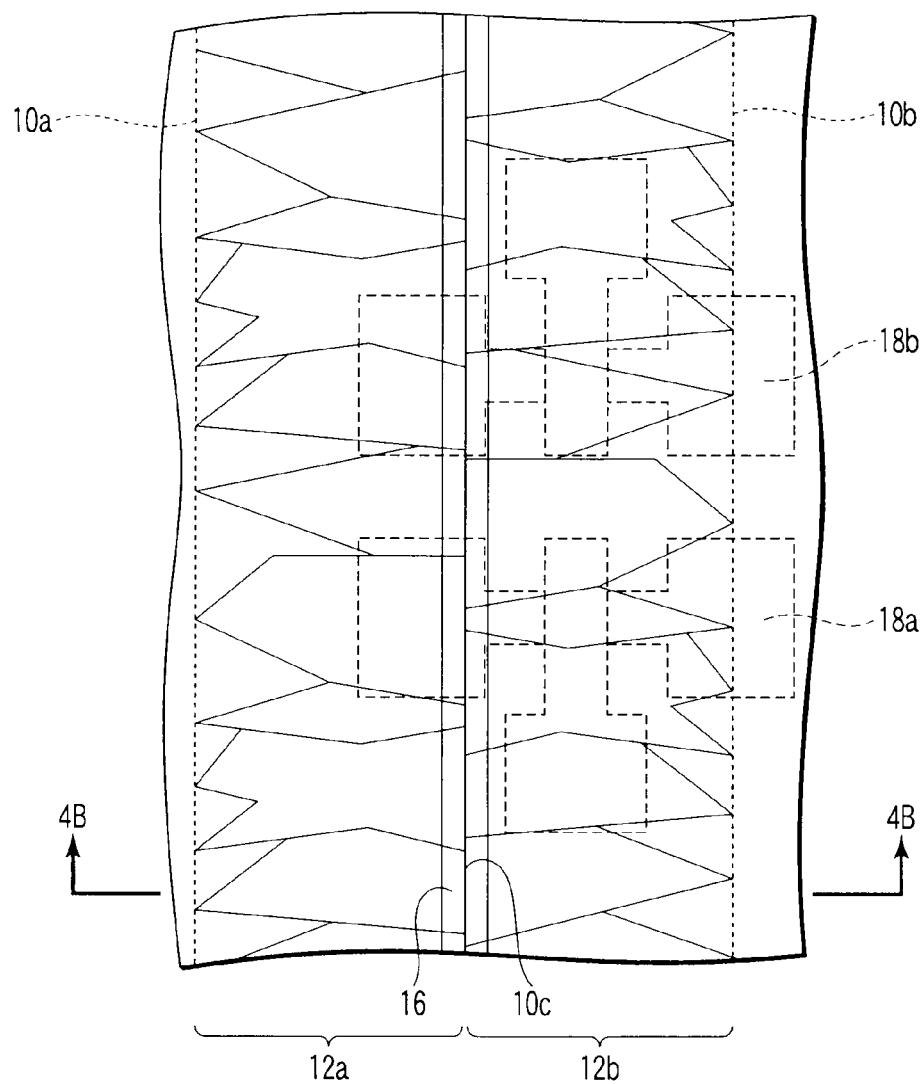
FIG. 4A is a plan view schematically illustrating at where the active layers for TFTs are formed in the recrystallized semiconductor film on the insulating substrate.
Figure 4B:
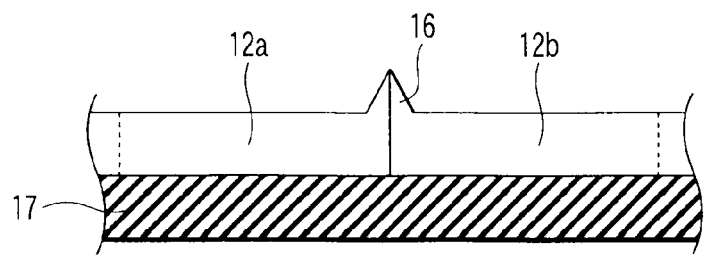
FIG. 4B is a sectional view taken along line C-C in FIG. 4A.

After the polycrystalline semiconductor thin films are formed by the method described with reference to FIGS. 1, 2A, 2B, 3A, and 3B, TFT is fabricated, for example, at positions shown at 18a and 18b in FIG. 4A. Island-like structures are formed by patterning the polycrystalline semiconductor thin film by dry etching to form a source/drain area and a channel area of TFT. Conditions for the dry etching are determined taking into account the film thickness of the polycrystalline semiconductor thin film and its distribution. In this case, the elevated portion 16 likely requires longer processing time of dry etching to be removed than other areas. As the result, as shown in FIGS. 5A and 5B, after the island-like TFTs 18a and 18b are formed with an optimal dry etch condition used, the lower portion of the elevated portion 16 of the polycrystalline semiconductor thin film may remain linearly and continuously. The remaining portion 16a of the semiconductor between the two adjacent TFTs 18a and 18b may cause TFTs to be short-circuited. The remaining portion 16a of the semiconductor can be removed by increasing the amount of time for the dry etching. However, in this case, an underlying insulating layer 17 is inevitably over-etched and may cause under-cut beneath the island structures of TFTs and connection failure of overlaying wirings.

To solve these problems, it is possible to locate the said TFTs 18a and 18b to separate the said TFTs and the remaining portion 16a of the semiconductor. However, this method is ineffective from the point of view of better utilization of recrystallized region of the semiconductor thin film since it requires larger margin between the said TFTs and the remaining portion 16a and longer wiring distance.

Figure 6:
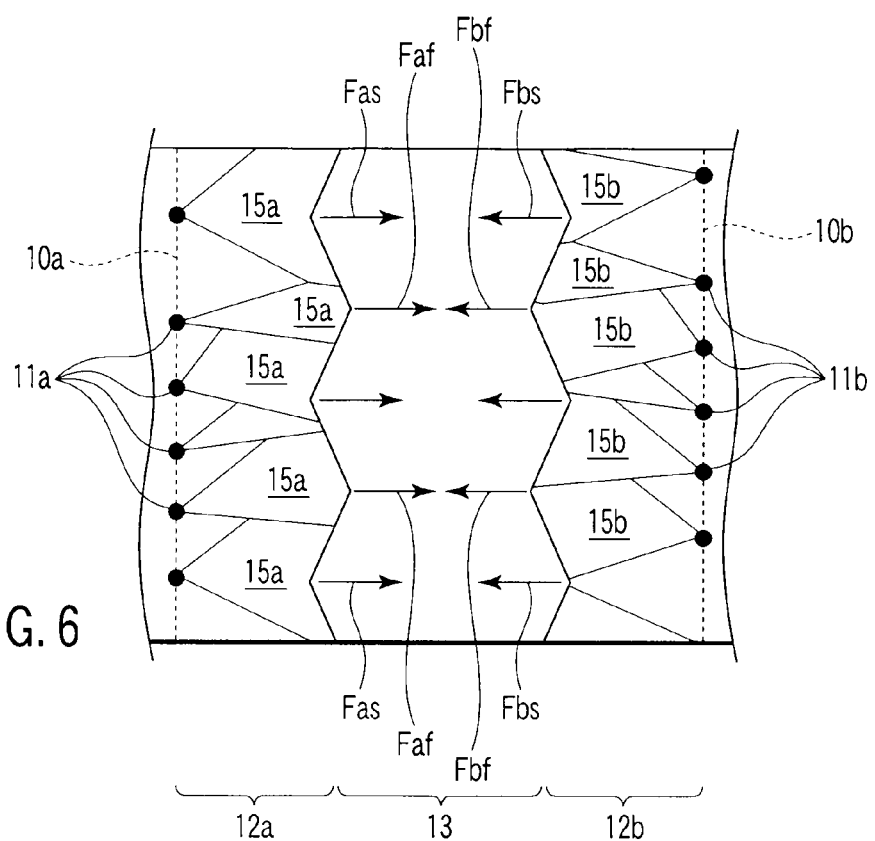
FIG. 6 is a plan view schematically showing how the growth speeds of grains are varied depending on the position orthogonal to the direction of the crystal growth according to the present invention.

As shown in FIG. 6, one technique according to the present invention controls the growth speed of the crystals such that when the crystal grains 15a and 15b grow horizontally in FIG. 6 from the crystal nuclei 11a and 11b, generated so as to lie along the two parallel straight lines 10a and 10b, the crystal growth speed cyclically increases and decreases in a direction (the vertical direction of the sheet of FIG. 6) orthogonal to the direction of the crystal growth according to the vertical direction. In FIG. 6, the growth speed of the crystals is the highest at the locations shown by arrows Faf and Fbf. The growth speed of the crystals is the lowest at the locations shown by arrows Fas and Fbs. The growth speed varies monotonously between the position with the highest growth speed and the position with the lowest growth speed.

Figure 7:
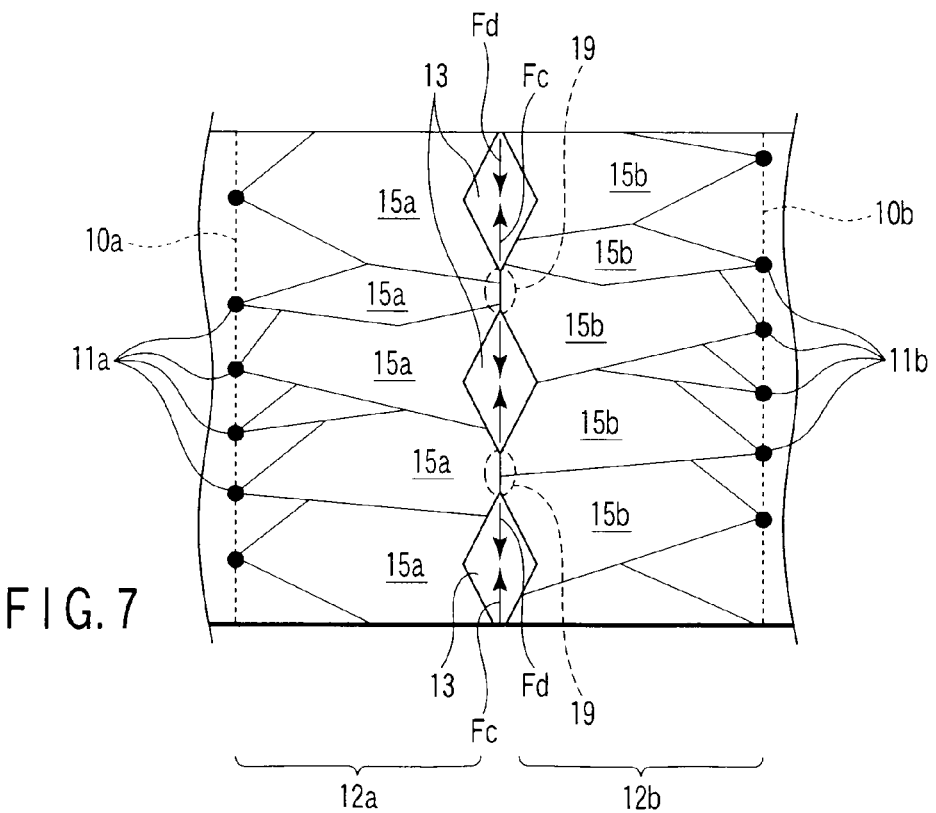
FIG. 7 is a plan view schematically showing the intermediate status of the crystal growth. Crystal grains with fastest speed of growth mutually collide at the center and continue growing in the direction orthogonal to the initial direction of the crystal growth.
Figure 8A:
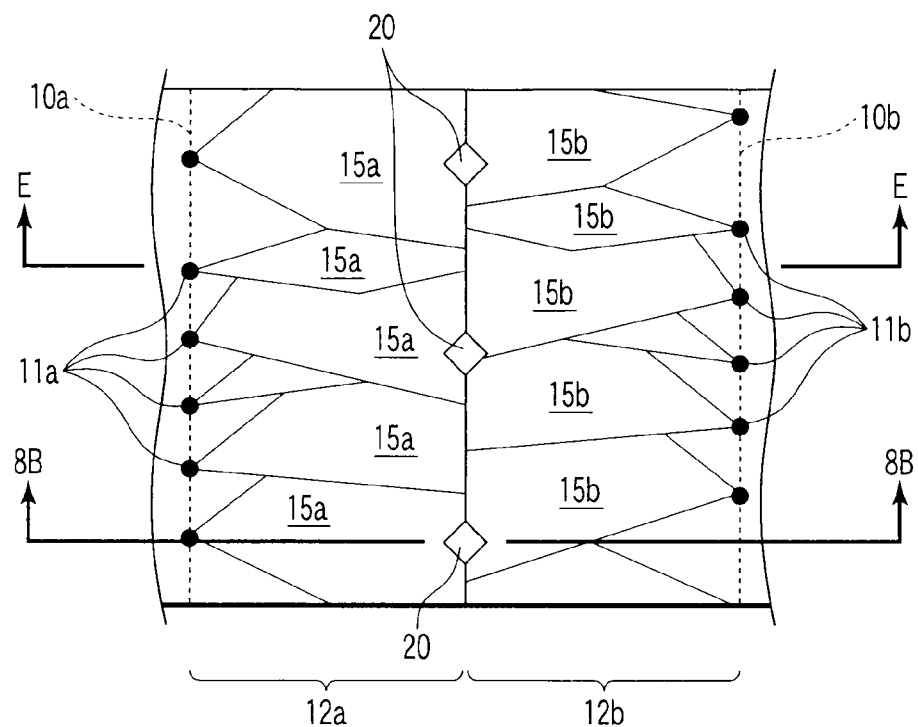
FIG. 8A is a plan view schematically showing final status after the entire semiconductor thin film has been crystallized. Pyramidal or conical hillocks are formed at intervals at the center where the growth speeds are the lowest in the first direction.
Figure 8B:
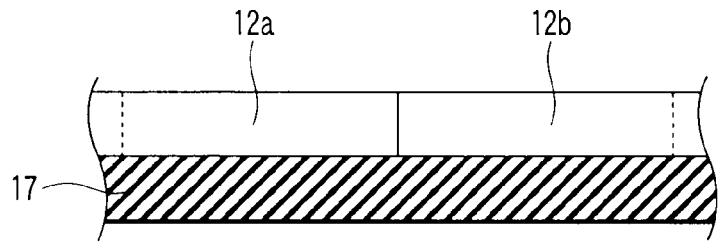
FIG. 8B is a sectional view taken along line E-E in FIG. 8A.
Figure 8C:
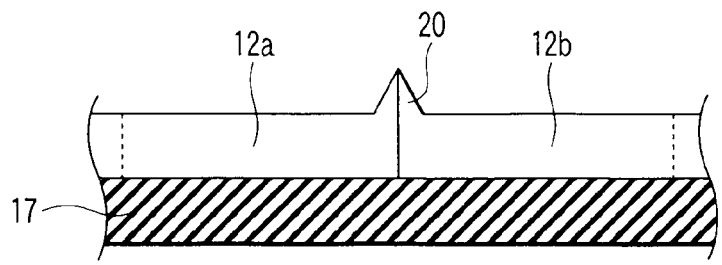
FIG. 8C is a sectional view taken along line F-F in FIG. 8A.

In this case, as shown in FIG. 7, at the locations with the highest growth speed, the crystal grains 15a collide against the crystal grains 15b at the central region 19 of the semiconductor film (denoted by dashed ellipse in FIG. 7) prior to the other locations. In the neighboring region of the region 19 of the semiconductor film, the crystal grains can continue growing in directions shown by arrows Fc and Fd in a direction (the vertical direction of the sheet of FIG. 7) orthogonal to the initial direction of the crystal growth, since the semiconductor is not crystallized yet in the said neighboring region. Thus crystal growth can occur without being elevated at the region 19 of the semiconductor. Consequently, with the entire surface of the semiconductor thin film crystallized, in that portion of the area with the lowest growth speed in which the crystal grains 15a collide against the crystal grains 15b, for example, pyramidal or conical raised portions 20 are formed at intervals like islands as shown in FIG. 8A. FIG. 8B and FIG. 8C are a sectional view taken along line E-E in FIG. 8A and a sectional view taken along line F-F in FIG. 8A.

In FIGS. 6 to 8c, the areas 12a and 12b are the areas of the polycrystalline semiconductor thin films crystallized from the initial nuclei 11a and 11b. In FIGS. 6 and 7, the area denoted by reference number 13 is the area of the amorphous semiconductor thin film, which is not crystallized. In FIGS. 8A, 8B, and 8C, reference number 17 denotes the insulating layer formed on the glass substrate (not shown).

Figure 9:
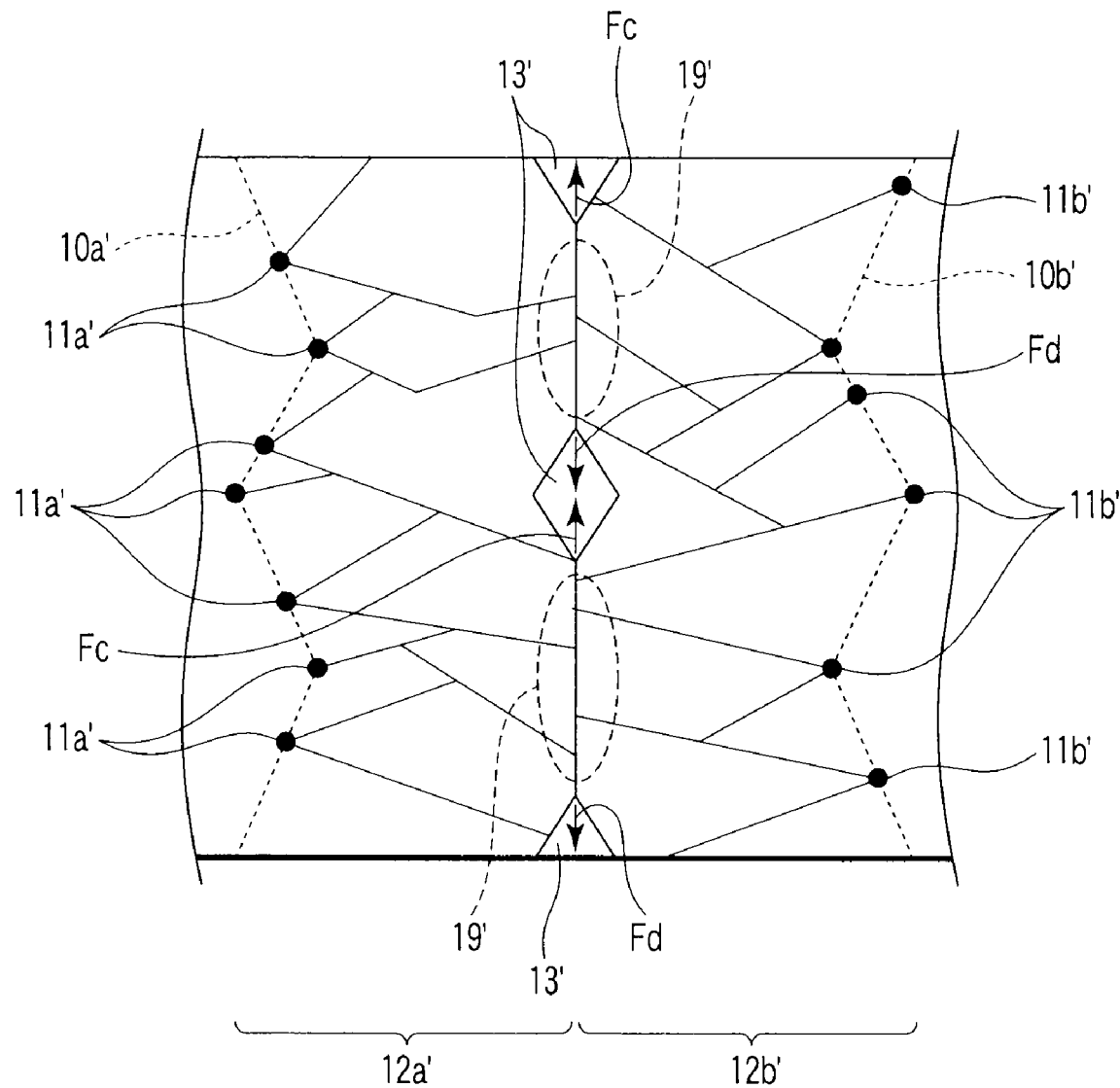
FIG. 9 is a plan view illustrating a technique of arranging the initial nuclei that serve as the starting point of grain growth at predetermined intervals.

Another technique according to the present invention allows the crystals growing horizontally from the initial nuclei to reach the elevated portion 16 at predetermined time intervals. A possible specific technique of allowing the crystals to reach the elevated portion 16 at the predetermined time intervals is to arrange the positions of the initial nuclei, corresponding to the crystallization start positions, at the predetermined intervals. In this case, as shown in FIG. 9, initial nuclei 11a' and 11b' corresponding to crystallization start positions are generated along broken lines 10a' and 10b' and arranged such that the positions of the crystal nuclei 11a' and 11b' in the direction of crystal growth (the horizontal direction of the sheet of FIG. 9) are placed at predetermined repetition intervals. Crystals grown from portions of the semiconductor closest to each collision position 13' in the direction of crystal growth collide against one another the earliest.

However, in the collision portion (shown by a dashed ellipse in FIG. 9) 19', the crystal growth can occur in the directions shown by arrows Fc and Fd in the direction (the vertical direction of the sheet of FIG. 9) orthogonal to the initial direction of crystal growth. Thus, in the collision portion 19', the semiconductor is prevented from being elevated. Consequently, with the entire surface of the semiconductor thin film crystallized, in that portion of the area with the lowest growth speed in which the crystal grains 15a collide against the crystal grains 15b, for example, the pyramidal or conical raised portions 20 are formed at intervals like islands as shown in FIG. 8. In FIG. 9, areas denoted by reference numbers 12a' and 12b' are the areas of the polycrystalline semiconductor thin films crystallized from the crystal nuclei 11a' and 11b'. In FIG. 9, the area denoted by reference number 13' is the area of the semiconductor thin film, which is not crystallized.

Figure 10A:
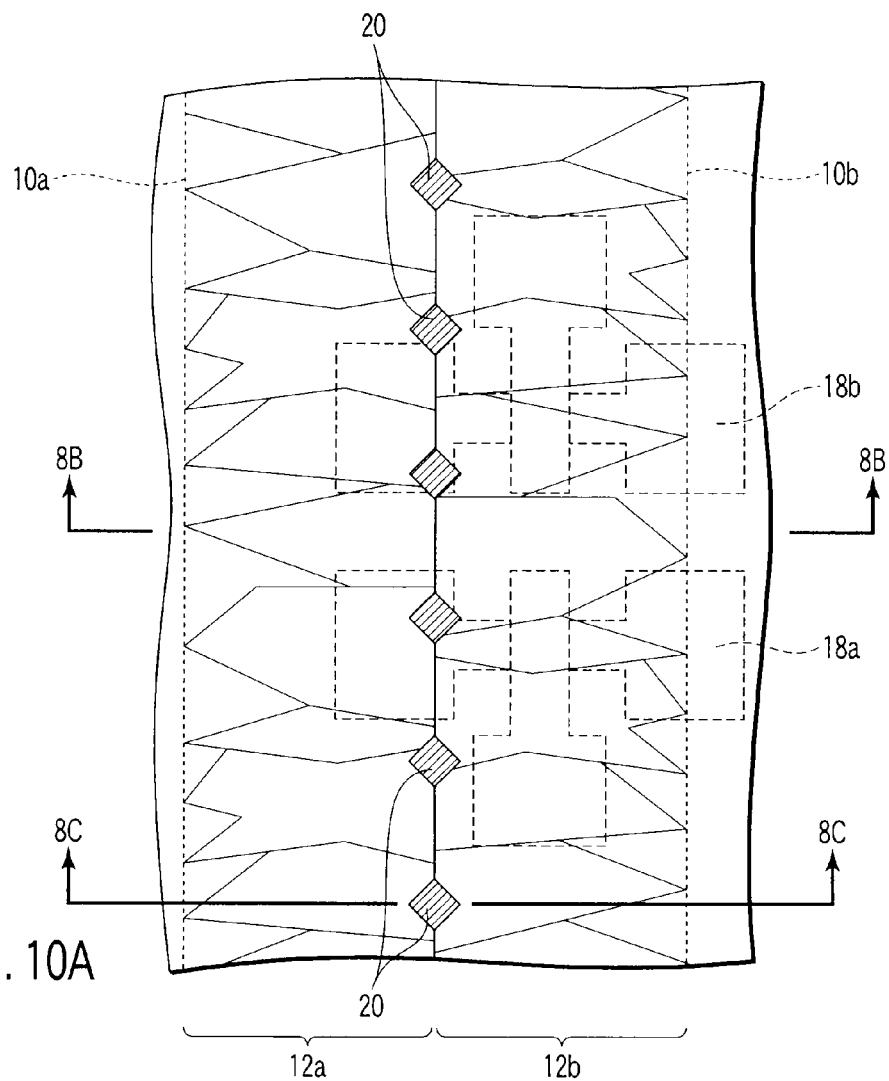
FIG. 10A is a plan view schematically illustrating that the polycrystalline semiconductor thin film recrystallized according to the present invention is used to form the active layers for TFTs on the insulating substrate.
Figure 10B:
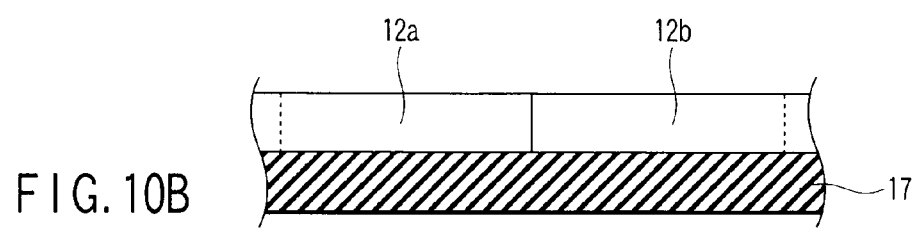
FIG. 10B is a sectional view taken along line G-G in FIG. 10A.
Figure 10C:
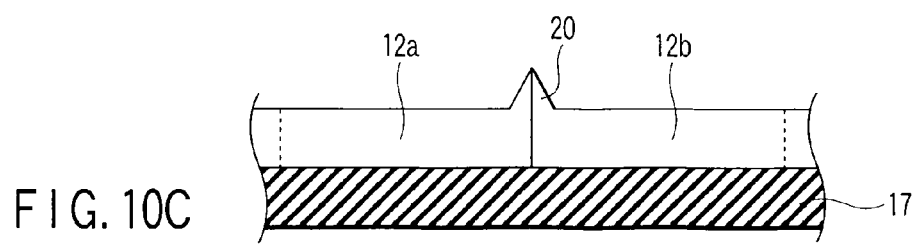
FIG. 10C is a sectional view taken along line H-H in FIG. 10A.
Figure 11A:
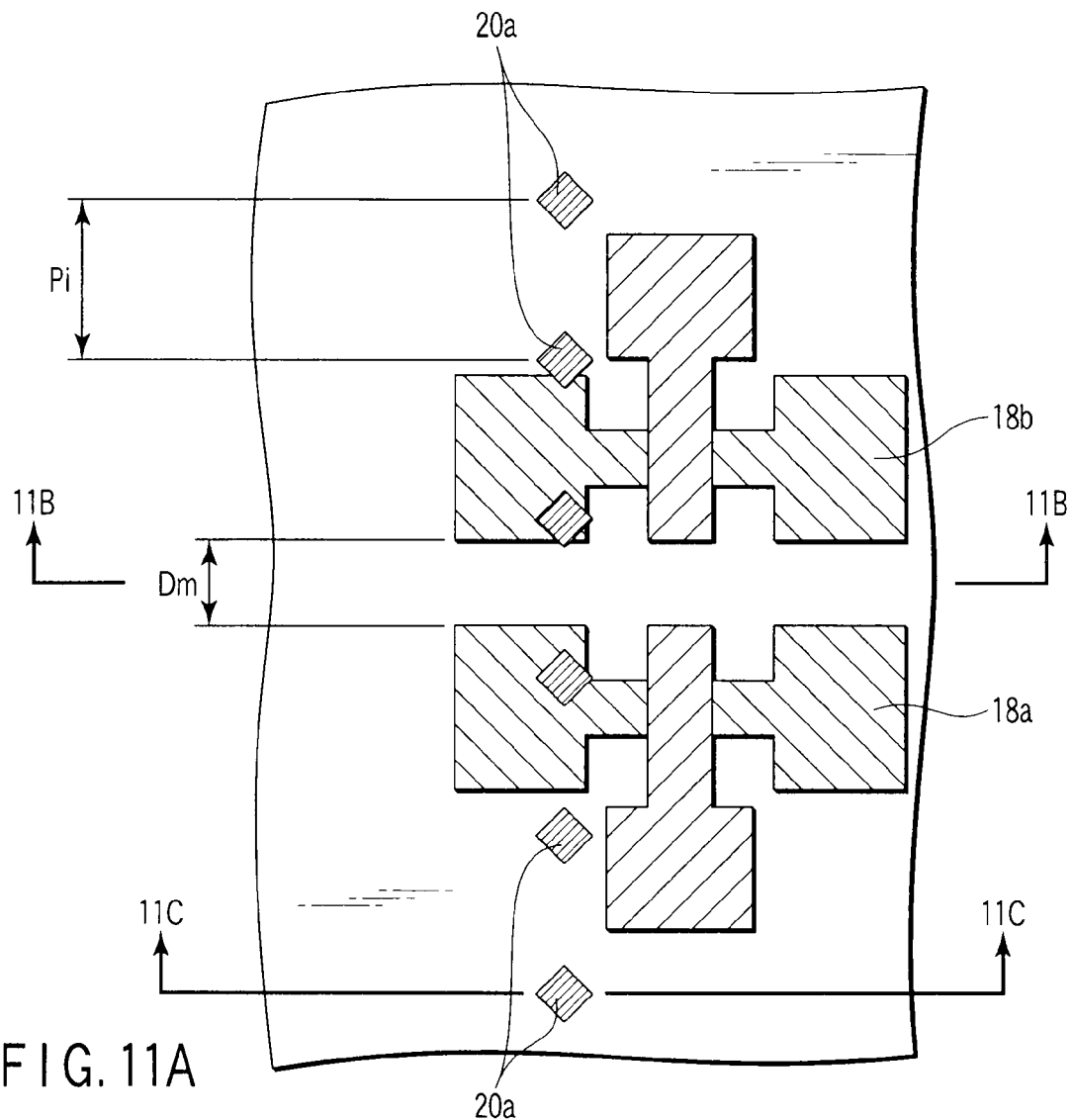
FIG. 11A is a plan view schematically showing that the present invention prevents the two TFTs being short-circuited by the portion of the semiconductor which remains after the formation of the active layers for TFTs.
Figure 11B:
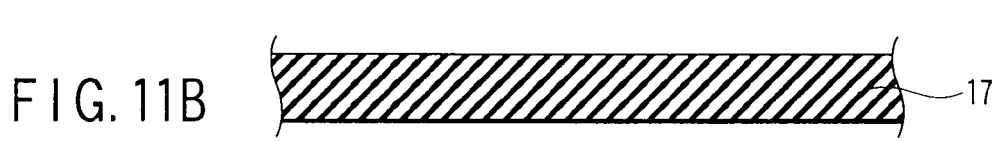
FIG. 11B is a sectional view taken along line J-J in FIG. 11A.
Figure 11C:
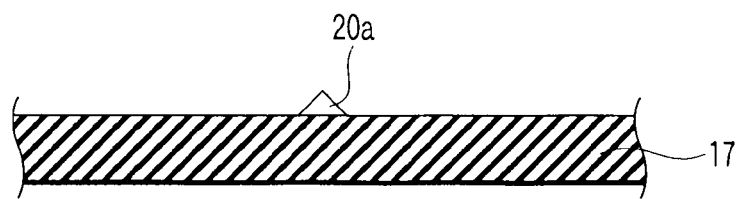
FIG. 11C is a sectional view taken along line K-K in FIG. 11A.

According to the present invention, as described with reference to FIGS. 6 to 8, the recrystallized polycrystalline semiconductor thin film is formed on an insulating substrate (for example, a glass substrate+an insulating layer), and TFTs 18a and 18b are formed on the polycrystalline semiconductor thin film at predetermined positions, for example, as shown in FIG. 10A. As a result, as shown in FIG. 11A, after the formation of TFTs 18a and 18b, for example, only pyramidal or conical remaining portions 20a of the semiconductor are formed at intervals like islands. The linearly remaining portion 16A of the semiconductor shown in FIG. 5A, which may short-circuit the two adjacent TFTs 18a and 18b, does not remain after the formation of said TFTs 18a and 18b. Thus, these TFTs can be reliably separated from each other.

A further description will be given of the relationship between the remaining portions 20a of the semiconductor and the short-circuiting of TFTs.

Figure 13:
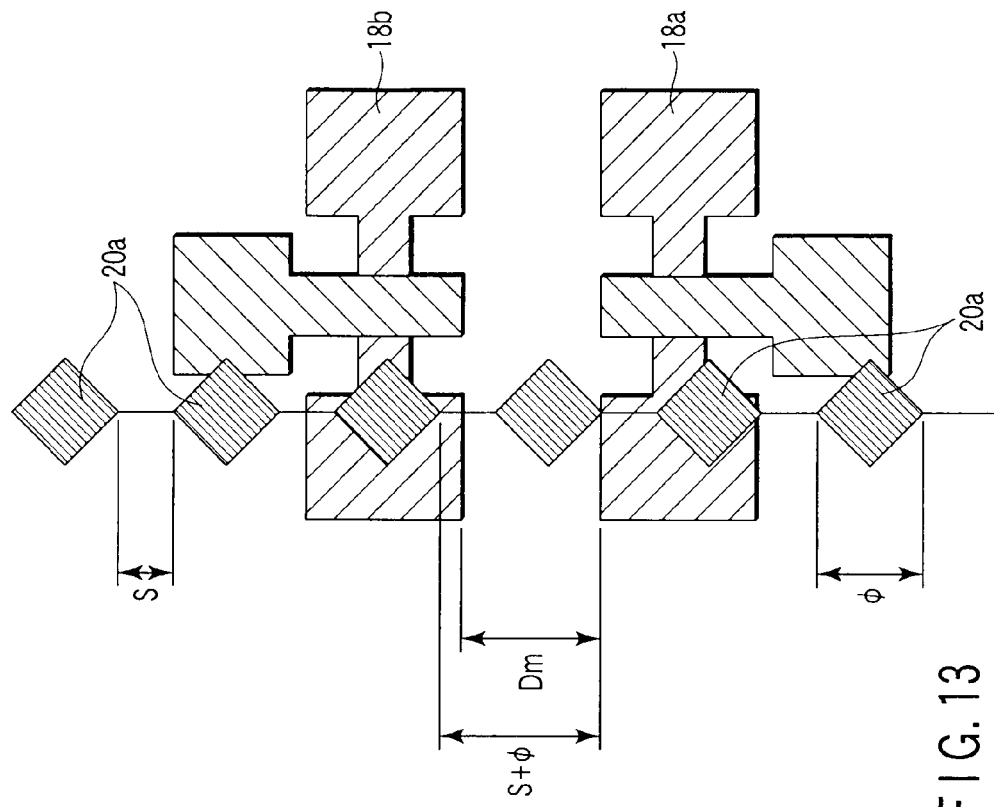
FIG. 13 is a plan view illustrating the first condition under which the two TFTs are likely to be short-circuited.
Figure 12:
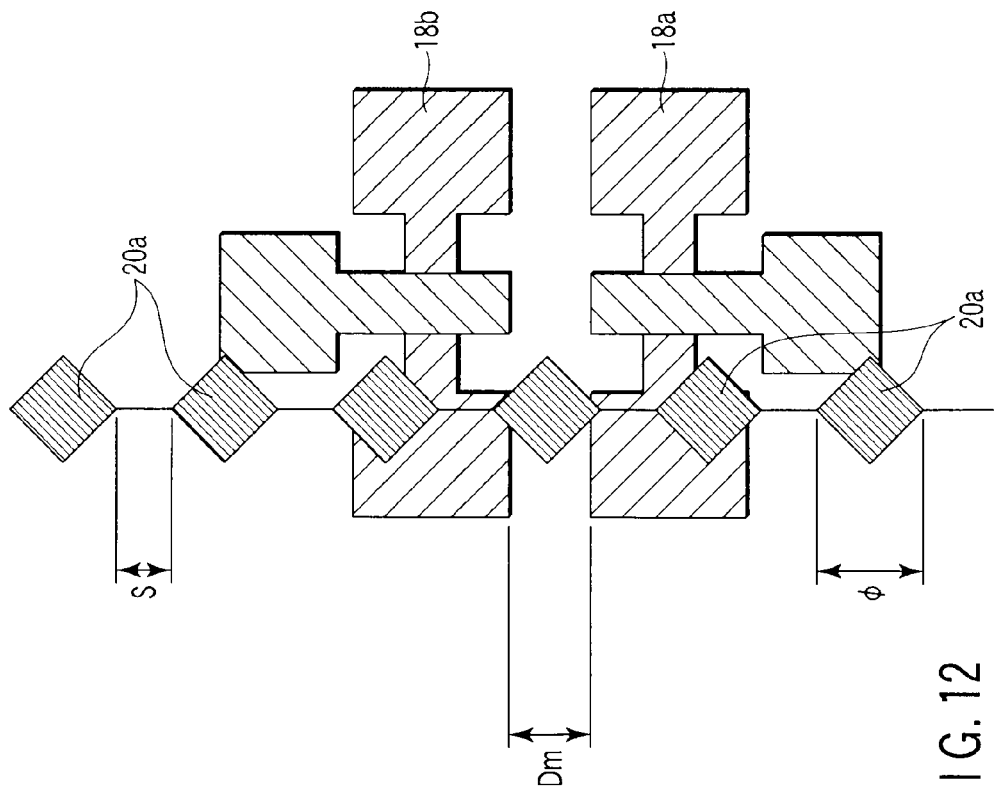
FIG. 12 is a plan view illustrating the first condition under which the two TFTs are short-circuited.

If the size (for example, the diameter of a circle circumscribing the remaining potions 20a) φ of each of the remaining portions 20a is greater than the interval S between the remaining portions 20a as shown in FIG. 12, when the size φ of the remaining portions 20a is greater than the distance (that is, the minimum design rule) Dm between TFTs 18a and 18b, TFTs 18a and 18b can be short-circuited directly via the remaining portions 20a. In view of the fact that the remaining portions 20a and the TFTs are formed of the same polycrystalline semiconductor thin film, even if the size φ is smaller than the interval Dm as shown in FIG. 13, when the sum of the distance S and size φ which ensures the insulation between the layers of the same polycrystalline semiconductor thin film is greater than the interval Dm, the interval between TFT 18a or 18b and the corresponding remaining portion 20a is excessively short. The layers of the same polycrystalline semiconductor thin film are thus likely to be short-circuited.

Figure 15:
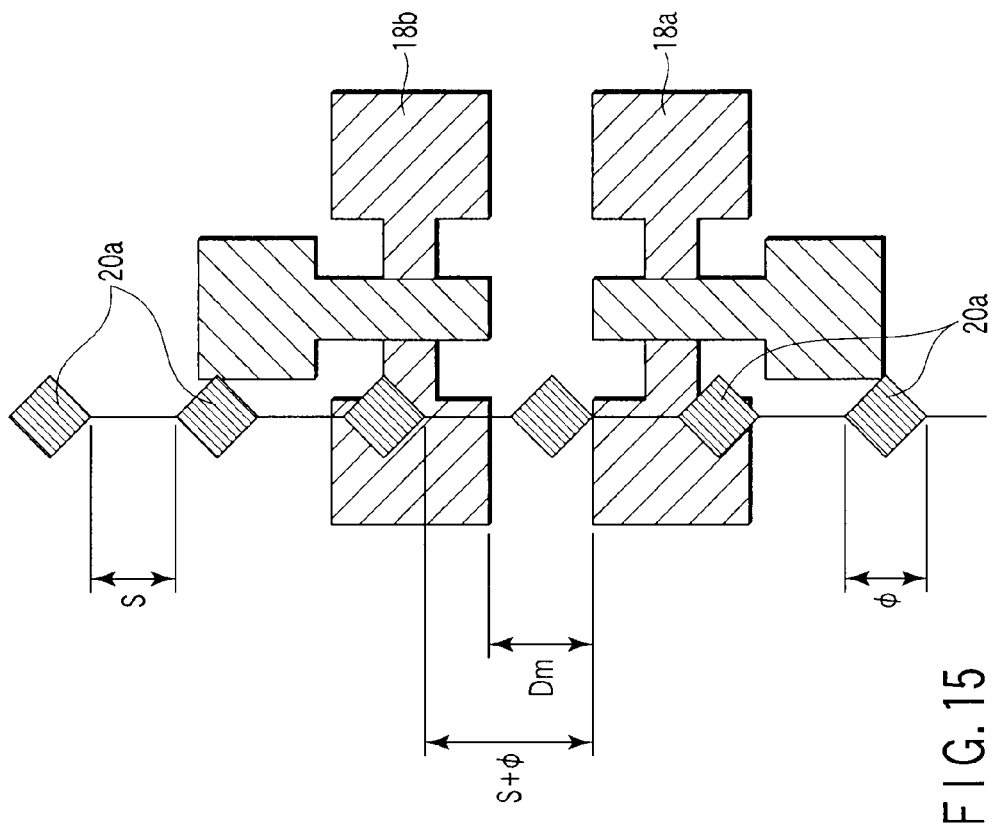
FIG. 15 is a diagram illustrating the second condition under which the two TFTs are likely to be short-circuited.
Figure 14:
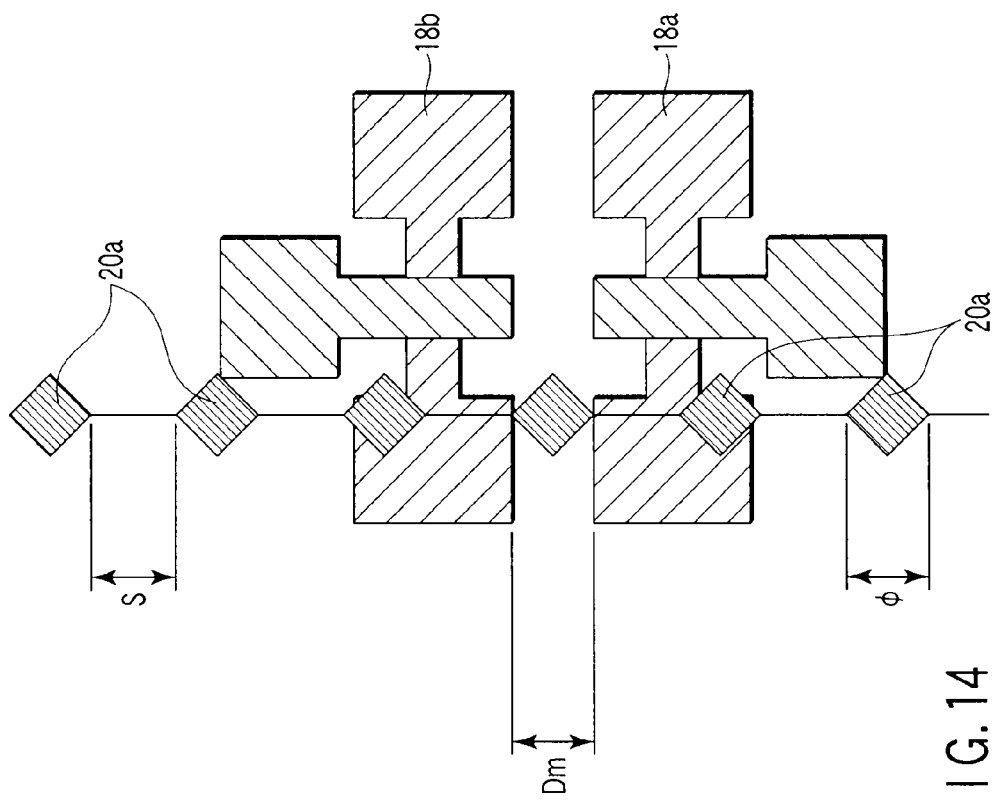
FIG. 14 is a plan view illustrating the second condition under which the two TFTs are short-circuited.

On the other hand, if the external size φ of the remaining portion 20a is smaller than the interval S as shown in FIG. 14, when the interval Dm between TFTs 18a and 18b is smaller than the size φ of the remaining portion 20a, TFTs 18a and 18b can be short-circuited directly via the remaining portions 20a. In view of the fact that the remaining portions 20a and the TFTs are formed of the same polycrystalline semiconductor thin film, even if the size φ is smaller than the interval Dm as shown in FIG. 15, when the sum of the minimum distance S and size φ which ensures the insulation between the layers of the same polycrystalline semiconductor thin film is greater than the interval Dm, the interval between TFT 18a or 18b and the corresponding remaining portion 20a is excessively short. The layers of the same polycrystalline semiconductor thin film are thus likely to be short-circuited.

As described above, to prevent the two TFTs from being short-circuited, it is necessary to take into account the size φ of the remaining portion 20a, and the minimum distance S and interval Dm which can ensure the insulation between the layers of the same polycrystalline semiconductor thin film. To reliably prevent the two adjacent TFTs 18a and 18b from being short-circuited, it is preferable to control the crystal growth or set the minimum design rule such that the sum S+φ (that is, the pitch Pi of the remaining portions 20a) of the interval S between the remaining portions (nodule shaped elevated portions) 20a and the size φ of the remaining portion 20a is smaller than the minimum design rule (that is, the interval between TFTs 18a and 18b) Dm as shown in FIG. 16.

As described above, the present invention performs control such that the film thickness of the semiconductor thin film is greater in selected ones of the collision portions generated between the crystal grains growing in opposite directions as a result of the crystal growth of the semiconductor than in the other collision portions. In other words, according to the present invention, for example, when the groups of crystal grains grow from the initial nuclei generated so as to lie along the two parallel straight lines, the growth speed of the crystals is controlled such that the growth speed cyclically increases and decreases in the direction orthogonal to the direction of crystal growth. In other words, the present invention controls the crystal growth such that the groups of crystal grains grown in opposite directions collide against each other earlier in a plurality of areas arranged at the intervals in the direction orthogonal to that of crystal growth than in the other areas.

As a result, unlike the conventional technique with which the elevated portion of the semiconductor remains linearly and continuously after the formation of the active layers for TFTs, the present invention forms the remaining portions of the semiconductor at intervals so that the remaining positions are isolated from one another. The two TFTs are reliably prevented from being short-circuited. In the above description, the present invention is applied to PMELA. However, the present invention is similarly applicable to other methods of forming a polycrystalline semiconductor film crystallinically grown on an insulating substrate in one direction.

Figure 18:
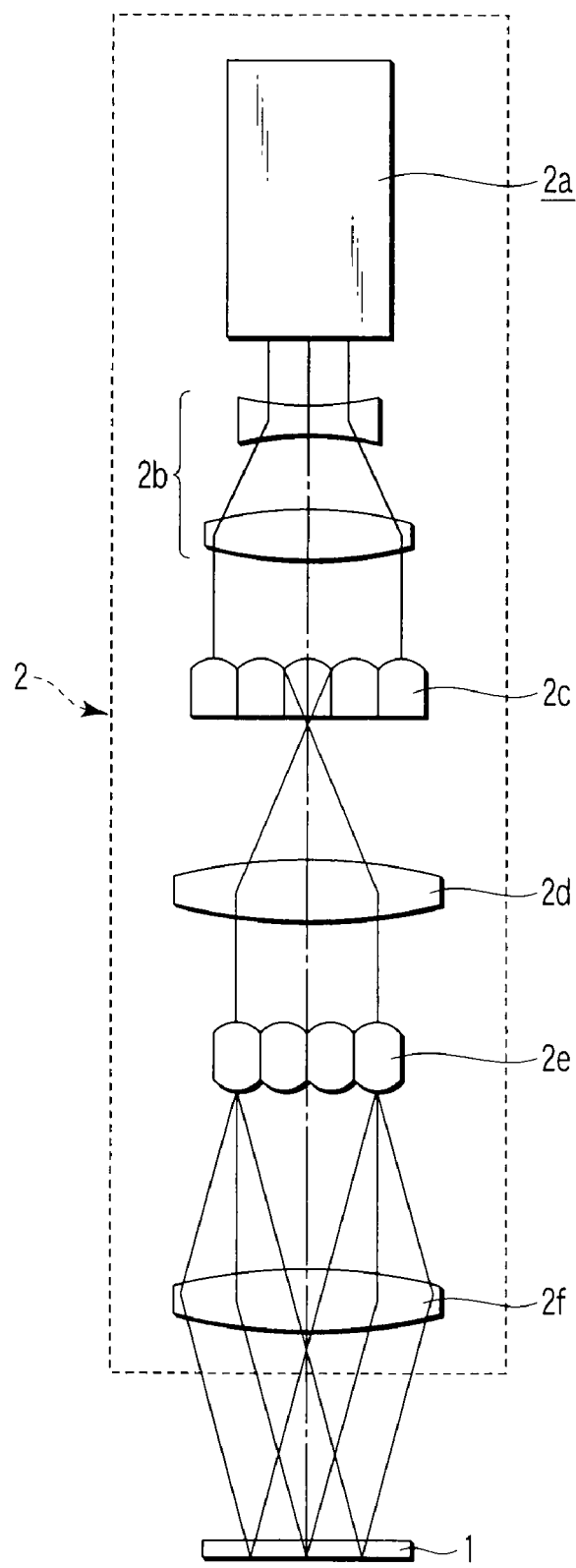
FIG. 18 is a diagram schematically showing the internal configuration of an illumination system in the crystallization apparatus shown in FIG. 17.

With reference to the attached drawings, description will be given of a method of manufacturing a thin-film semiconductor device according to an embodiment of the present invention. FIG. 17 is a diagram schematically showing the configuration of a crystallization apparatus for use in the manufacture of the thin-film semiconductor device according to the embodiment of the present invention. FIG. 18 is a diagram schematically showing the internal configuration of an illumination system in FIG. 17. As shown in FIGS. 17 and 18, the crystallization apparatus used in the present embodiment comprises a light modulating element 1 that modulates the phase of an incident luminous flux to form a luminous flux having a predetermined light intensity distribution, the illumination system 2 that illuminates the light modulating element 1, an image forming optical system 3, and a substrate stage 5 that holds a process target substrate 4.

The configuration and operation of the light modulating element 1 will be described below. As shown in FIG. 18, the illumination system 2 comprises an XeCl excimer laser light source 2a that supplies laser light having, for example, a wavelength of 308 nm. It is also possible to use, as the light source 2a, another appropriate light source such as a KrF excimer laser light source or a YAG laser light source which is capable of emitting an energy light beam that melts the process target substrate 4. Laser light supplied by the light source 2a passes through a beam expander 2b, in which the laser light is enlarged. The resultant laser light enters the first fly eye lens 2c.

A plurality of small light sources are formed on a rear focal surface of the first fly eye lens 2c. Luminous fluxes from the plurality of small light sources pass through the first condenser optical system 2d and then superimposedly illuminates an incident surface of the second fly eye lens 2e. As a result, more small light sources re formed on a rear focal surface of the second fly eye lens 2e than on the rear focal surface of the first fly eye lens 2c. Luminous fluxes from the plurality of small light sources formed on the rear focal surface of the second fly eye lens 2e pass through the second condenser optical system 2f and then superimposedly illuminates the light modulating element 1.

The first fly eye lens 2c and the first condenser optical system 2d constitute the first homogenizer. The first homogenizer homogenizes the incident angle, on the light modulating element 1, of laser light emitted by the light source 2a. The second fly eye lens 2e and the second condenser optical system 2f constitute the second homogenizer. The second homogenizer homogenizes the light intensity, at appropriate in-plane positions on the light modulating element 1, of the laser light from the first homogenizer having the homogenized incident angle.

The laser light with the phase modulated by the light modulating element 1 enters the process target substrate 4 via the image forming optical system 3. Here, the image forming optical system 3 optically conjugately arranges a phase pattern surface of the light modulating element 1 and the process target substrate 4. In other words, the process target substrate 4 (strictly speaking, an irradiated surface of the process target substrate 4) is set on a surface (an image surface of the image forming optical system 3) optically conjugate to the phase pattern surface of the optical modulating element 1.

The image forming optical system 3 comprises, for example, a positive lens group 3a, a positive lens group 3b, and an aperture stop 3c located between the lens groups. The size (or the image-side numerical aperture NA of the image forming optical system 3) of the opening (light permeable portion) of the aperture stop 3c is set such that a required light intensity distribution is generated on a semiconductor film (irradiated surface) of the process target substrate 4. The image forming optical system 3 may be a refractive optical system, a reflective optical system, or a refractive and reflective optical system.

The process target substrate 4 is formed by depositing a lower insulating film, a non-single-crystal semiconductor thin film, an upper insulating film on the substrate in this order. More specifically, in the present embodiment, the process target substrate 4 is obtained by, for example, sequentially forming an under insulating film, a non-single-crystal semiconductor film (for example, an amorphous silicon film), and a cap film on a liquid crystal display plate glass in this order by means of chemical vapor deposition (CVD). Each of the under insulating film and the cap film is an insulating film, for example, an $SiO_2$ film. The under insulating film prevents a situation in which the amorphous silicon film directly contacts the glass substrate, so that foreign matter such as Na in the glass substrate is mixed into the amorphous silicon film. The under insulating film thus prevents heat from the amorphous silicon film from being transmitted directly to the glass substrate.

The amorphous silicon film is a semiconductor film to be crystallized. The cap film is heated by part of a light beam incident on the amorphous silicon film and accumulates the heat generated. When the incidence of the light beam is blocked, the temperature of the hot portion of the irradiated surface of the amorphous silicon film relatively decreases rapidly. However, the above-described heat accumulation effect reduces this temperature decrease gradient to promote the horizontal crystal growth of crystal grains of a larger size. The process target substrate 4 is placed and held at a predetermined position on the substrate stage 5 by a vacuum chuck or an electrostatic chuck.

Figure 19:
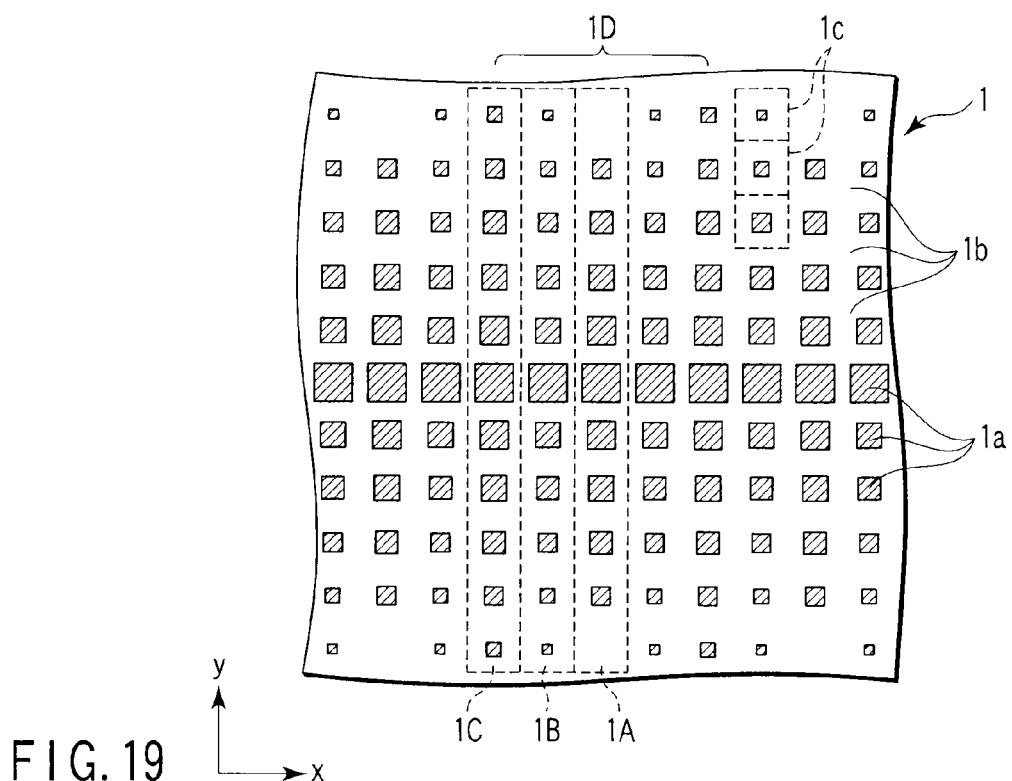
FIG. 19 is a diagram schematically showing the configuration of a light modulating element in the crystallization apparatus shown in FIG. 17.

FIG. 19 is a diagram schematically showing the configuration of the light modulating element in the crystallization apparatus for use in the present embodiment. As shown in FIG. 19, the light modulating element 1 in the crystallization apparatus for use in the present embodiment has a basic pattern in which three types of elongate band-like areas 1A, 1B, and 1C extending along a Y-axis (the vertical direction of FIG. 19) are repeatedly arranged along an X-axis (the horizontal direction of FIG. 19). In FIG. 19, reference number 1D denotes a repetitive unit area of the basic pattern. In the band-like areas 1A, 1B, and 1C, constituting the unit structure, rectangular areas 1a shaded in FIG. 19 each have a phase value of +90 degrees. An area 1b shown by a blank portion in FIG. 19 has a phase value of 0 degree.

The phase value indicates the amount of phase modulation applied to light passing through the light modulating element. The direction of phase lead is defined as a positive side. For example, a phase value of +90 degrees means that this phase leads a phase with a reference phase value of 0 degrees. The light modulating element 1 is produced by etching the surface of a substrate made up of, for example, synthetic quartz (generally, a light-permeable substrate). The light modulating element 1 used for light with a wavelength of 308 nm, the rectangular areas 1a are formed by engraving the semiconductor into recess portions of depth 157 nm on the basis of the area 1b with a phase value of 0 degree.

The pitch of the band-like areas 1A, 1B, and 1C along the X-axis is 1 μm in terms of the image surface of the image forming optical system 3. In other words 1A, 1B, and 1C, 11 square cells (unit areas) 1c of size 1 μm×1 μm in terms of the image surface of the image forming optical system 3 are arranged along the Y-axis. The size of the cell 1c of 1 μm×1 μm in terms of the image surface of the image forming optical system 3 is set to be smaller than the dot image distribution range of the image forming optical system 3, that is, 1.25 μm.

In the band-like areas 1A, 1B, and 1C, the ratio of the area 1a with a phase value of +90 degrees to the area 1b with a phase value of 0 degree varies with the cell along the Y-axis. In other words, in the band-like areas 1A, 1B, and 1C, the occupied area rate of the area 1a in each cell varies at a predetermined change rate along the Y-axis. Specifically, the occupied area rate of the area 1a in each cell is greatest in the center of the band-like areas 1A, 1B, and 1C and decrease monotonously toward the opposite ends of band-like areas.

In the first band-like area 1A, the occupied area rate of the area 1a in each cell has the greatest change rate. In the third band-like area 1C, the occupied area rate of the area 1a in each cell has the smallest change rate. In the second band-like area 1B, located between the first band-like area 1A and the third band-like area 1C, the change rate of the occupied area rate of the area 1a in each cell has an intermediate value between the change rate for the first band-like area 1A and the change rate for the third band-like area 1C. That is, in the light modulating element 1, the change rate of the occupied area rate of the area 1a in each cell increases and decreases along the X-axis for each band-like area.

With the optical system of the crystallization apparatus for used in the present embodiment, the light modulating element 1, shown in FIG. 19, was used to calculate a light intensity distribution formed on the process target substrate 4. Conditions for the calculation are as follows. The wavelength of light is 308 nm, and the image forming optical system 3 has an image-side numerical aperture of 0.15. A coherence factor (illumination σ value; the emission-side numerical aperture of the illumination system/the object-side numerical aperture of the image forming optical system 3) is 0.5, and the image forming optical system 3 has an image formation magnification of ⅕. The radius of the dot image distribution range of the image forming optical system 3 is given by 0.61λ/NA (λ: wavelength, NA: image-side numerical aperture). Substituting λ=0.308 μm and NA=0.15 into this formula results in a value of 1.25 μm described above.

Figure 20:
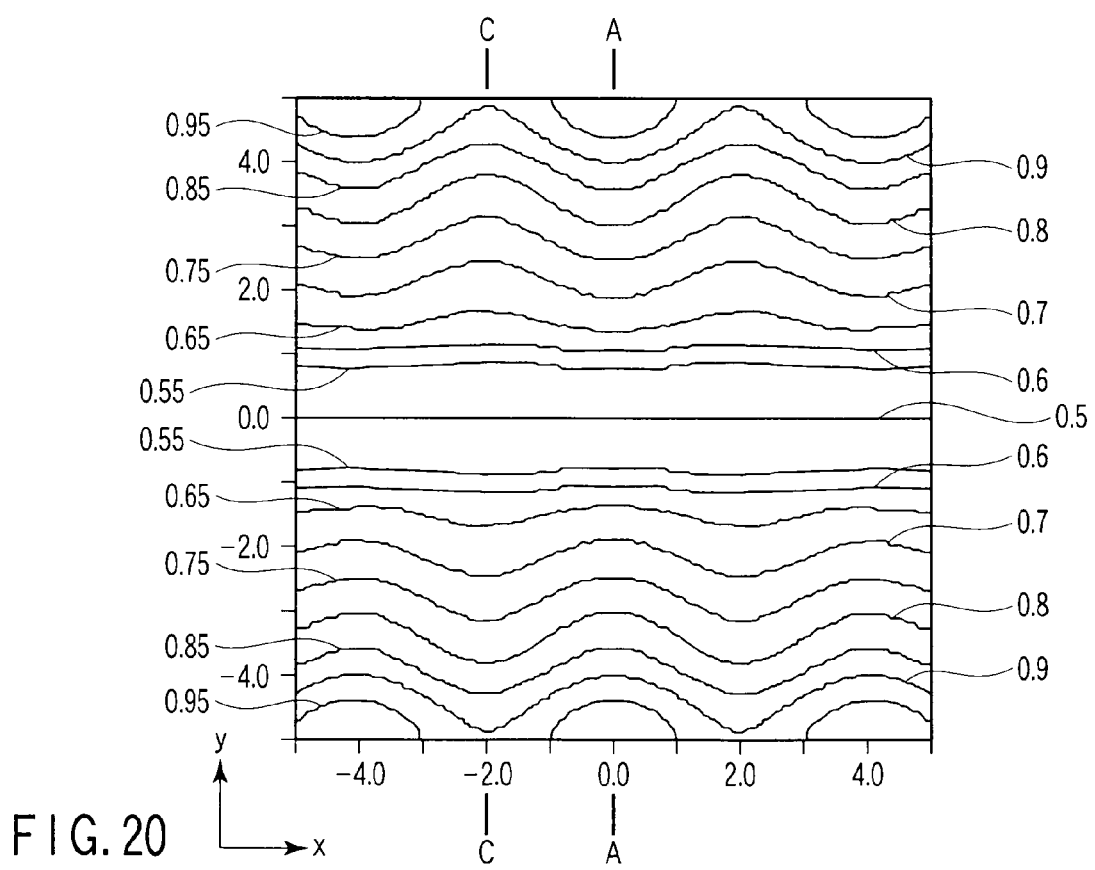
FIG. 20 is a diagram showing a light intensity distribution obtained on a process target substrate using the light modulating element shown in FIG. 19.

In the present embodiment, the calculation indicated that such a light intensity distribution as shown in FIG. 2 is obtained on the process target substrate 4 (on the image surface of the image forming optical system 3). FIG. 20 shows contour lines of the light intensity (that is, isointensity lines) obtained when the light intensity obtained without modulation is normalized to 1. In FIG. 20, a position shown by line A-A corresponds to a center line of the first band-like area 1A of the light modulating element 1 along the Y-axis. A position shown by line C-C corresponds to a center line of the third band-like area 1C of the light modulating element 1 along the Y-axis.

Figure 21:
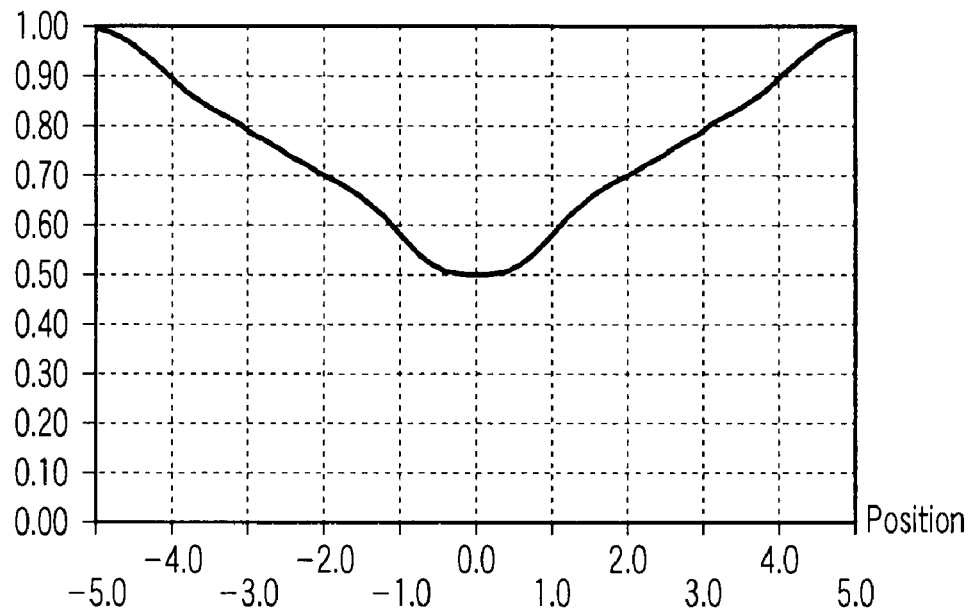
FIG. 21 is a diagram showing a light intensity distribution along a line L-L in FIG. 20.
Figure 22:
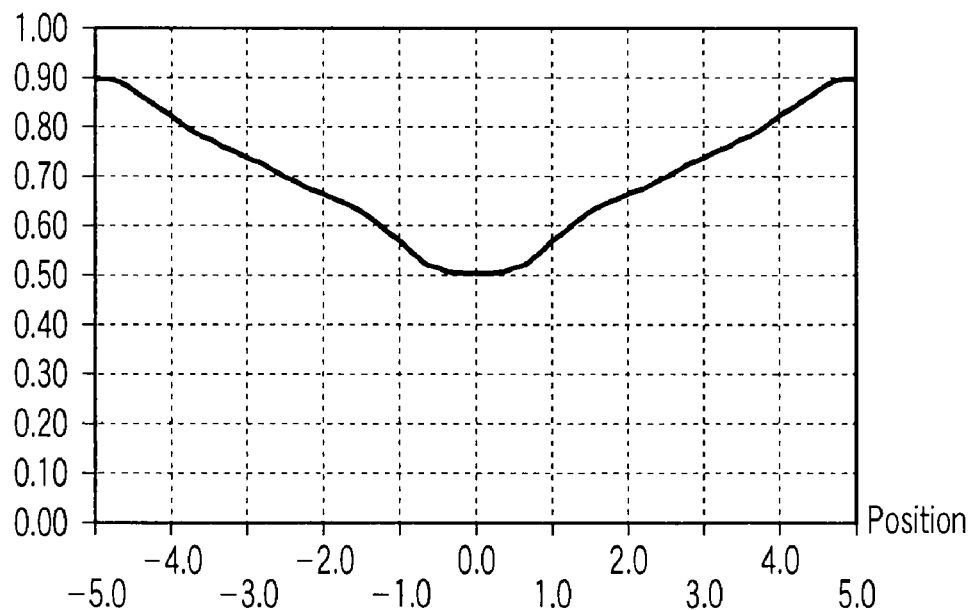
FIG. 22 is a diagram showing a light intensity distribution along a line M-M in FIG. 20.

FIG. 21 shows a light intensity distribution observed along line A-A in FIG. 20. FIG. 22 shows a light intensity distribution observed along line C-C in FIG. 20. As shown in FIGS. 21 and 22, the light intensity distributions observed along lines A-A and C-C both show the light intensity varying in V shape along the Y-axis. However, the gradient of the light intensity varying in V shape is smaller along the line C-C than along the line A-A. That is, the present embodiment irradiates the non-single-crystal semiconductor film on the process target film 4, via the light modulating element 1 and the image forming optical system 3, with light exhibiting the distribution of the light intensity varying in V shape along the Y-axis and having the gradient increasing and decreasing along the X-axis.

The speed of the crystal growth has a property of increasing with decreasing gradient of the light intensity. Thus, in the present embodiment, the crystal growth along line C-C precedes the crystal grow along line A-A. As described above with reference to FIGS. 6 to 8, the groups of crystal grains grown in opposite directions collide against each other in the plurality of areas arranged at the intervals along the X-axis than in the other areas.

As a result, in the present embodiment, the remaining portions of the semiconductor are formed at the intervals along the X-axis. This makes it possible to reliably prevent the two adjacent TFTs from being short-circuited. In the present embodiment, the light modulating element 1, shown in FIG. 19, was actually produced. The light modulating element 1 produced and the image forming optical system 3 were used to measure the light intensity distribution formed on the process target substrate 4. The result of the measurement is almost equal to the light intensity distribution shown in FIG. 20.

FIGS. 23A to 23E are sectional views showing a process of producing an electronic device in the crystallized region of the semiconductor using the crystallization apparatus shown in FIG. 17.

Figure 23A:
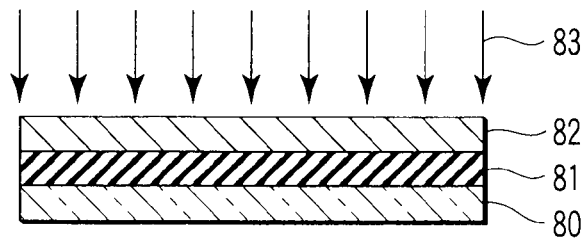
FIGS. 23A to 23E are sectional views showing a process of manufacturing a thin-film semiconductor device according to an embodiment of the present invention.

First, as shown in FIG. 23A, a precursor is prepared by depositing an underlying film 81 (for example, an SiN stack film of film thickness 50 nm or an $SiO_2$ stack film of film thickness 100 nm), an amorphous semiconductor film 82 (for example, a semiconductor film such as Si, Ge, or SiGe which has a film thickness of about 50 nm to 200 nm), and a cap film (for example, an $SiO_2$ film of film thickness 30 nm to 300 nm; not shown) on a transparent insulating substrate 80 (for example, alkali glass, quartz glass, plastic, or polyimide), by means of chemical vapor deposition or sputtering. Then, the crystallization apparatus shown in FIG. 17 is used to irradiate a preset area of a surface of the amorphous semiconductor with laser light 83 (for example, KrF excimer laser light or XeCl excimer laser light).

Figure 23B:
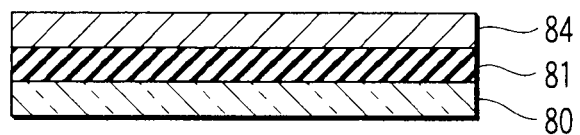

As a result, as shown in FIG. 23B a large grain polycrystalline semiconductor film or a recrystallized pseudo single crystal semiconductor film 84 is generated.

Figure 23C:
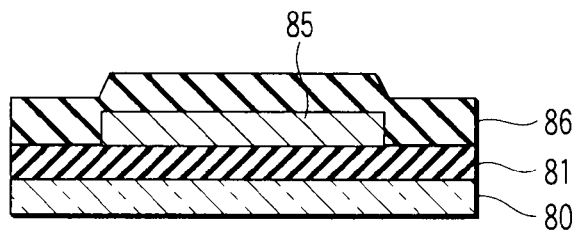

Then, the cap film is removed from the semiconductor film 84. As shown in FIG. 23C, a photolithography technique is used to process the polycrystalline semiconductor film or pseudo single crystal semiconductor film 84 into an island-like semiconductor film 85 constituting an area to be formed into, for example, a thin-film transistor. A $SiO_2$ film of film thickness 20 nm to 100 nm is then deposited on the surface of the semiconductor film 85 as a gate insulating film 86 by chemical vapor deposition, sputtering, or the like.

Figure 23D:
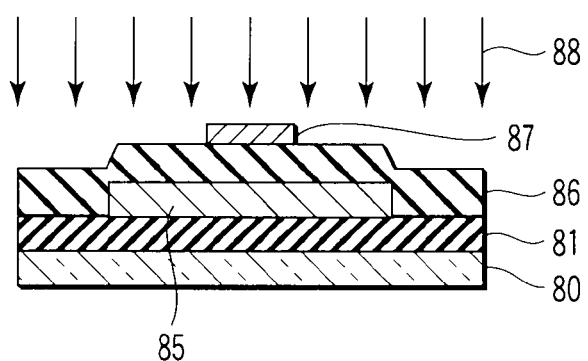

Then, as shown in FIG. 23D, a gate electrode 87 (for example, silicide or MoW) is formed on the gate insulating film. Impurity ions 88 (phosphorous for an n channel transistor and boron for a p channel transistor) are implanted into the resultant structure through the gate insulator film 86. The implant can be done in the self-aligned manner with the gate electrode 87 as the mask if applicable. An annealing process (for example, at 450° C. for one hour) is subsequently carried out in a nitrogen atmosphere to activate the impurities to form a source area 91 and a drain area 92 in the island-like semiconductor film 85.

Figure 23E:
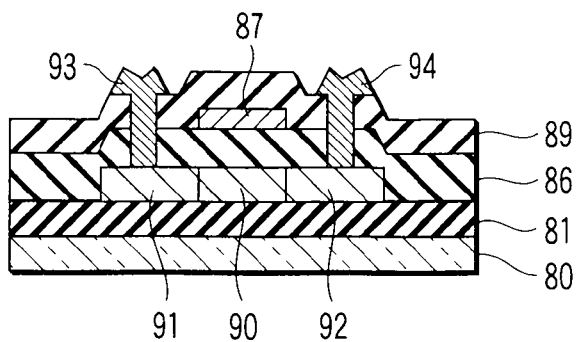

Subsequently, as shown in FIG. 23E, an interlayer insulating film 89 is deposited and contact holes are formed in the interlayer insulating film 89. Then, a source electrode 93 and a drain electrode 94 are formed.

In the above-described steps, the channel 90 is formed within the grains, or preferably a single grain, of recrystallized region 12a and 12b shown in FIG. 8A of the semiconductor film 84 generated in the steps shown in FIGS. 23A and 23B. The above-described steps allow the thin-film transistor (TFT) to be formed on the large grain polycrystalline semiconductor film or pseudo single crystal semiconductor film. The thus manufactured polycrystalline semiconductor film or pseudo single crystal semiconductor film is applicable to a driving circuit for a liquid crystal display device (display), an EL (Electroluminescence) display, or the like, or an integrated circuit for a memory (SRAM or DRAM), CPU, or the like.

What is claimed is:

1. A method of forming a polycrystalline semiconductor film, comprising:
    irradiating an amorphous semiconductor film formed on an insulating substrate with light to convert the amorphous semiconductor into a laterally grown polycrystalline semiconductor to form a polycrystalline semiconductor film,
    wherein the irradiating step comprises controlling crystal growth in the amorphous semiconductor such that, on an X-axis and a Y-axis which are set with respect to a surface of the amorphous semiconductor film and which are orthogonal to each other, first crystal grains laterally grow in a first direction along the X-axis from a first group of initial nuclei on a first straight line extending along the Y-axis, second crystal grains laterally grow in a second direction opposite to the first direction along the X-axis from a second group of initial nuclei arranged on a second straight line extending along the Y-axis, apart from the first group of initial nuclei along the X-axis and the first straight line, the first crystal grains collide against the second crystal grains at different points in time along the Y-axis, and growing speeds of the first crystal grains and the second crystal grains vary between predetermined points along the Y-axis.

2. The method according to claim 1, wherein controlling the crystal growth in the amorphous semiconductor film such that the first crystal grains collide against the second crystal grains at the different points in time along the Y-axis is performed by controlling the crystal growth such that the first crystal grains laterally grow in the first direction along the X-axis from the first group of initial nuclei arranged at positions in the X-axis direction which vary along the Y-axis, and the second crystal laterally grow in the second direction opposite to the first direction from the second group of initial nuclei.

3. The method according to claim 1, wherein the first crystal grains and the second crystal grains grow laterally along the X-axis and collide against one another, and after the collision, the crystal growth in an area in which the collision occurs earlier than in an adjacent area along the Y-axis progresses to the adjacent area along the Y-axis in which the crystal growth has not started yet, and a plurality of isolated nodules are finally formed.

4. The method according to claim 1, wherein the light with which the amorphous semiconductor is irradiated, exhibits an intensity distribution varying in V shape along the X-axis and having a gradient which increases and decreases in intensity along the Y-axis.

5. The method according to claim 4, wherein the light exhibiting the intensity distribution varying in V shape along the X-axis and having a gradient of cyclic increase and decrease along the Y-axis is formed by a light modulating element.

6. A method of forming a polycrystalline semiconductor film, comprising:
   irradiating an amorphous semiconductor film formed on an insulating substrate with light to convert the amorphous semiconductor into a laterally grown polycrystalline semiconductor to form a polycrystalline semiconductor film, wherein
   the irradiating step comprises controlling crystal growth in the amorphous semiconductor such that, on an X-axis and a Y-axis which are set with respect to a surface of the amorphous semiconductor film and which are orthogonal to each other, first crystal grains laterally grow in a first direction along the X-axis from a first group of initial nuclei, second crystal grains laterally grow in a second direction opposite to the first direction along the X-axis from a second group of initial nuclei arranged apart from the first group of initial nuclei along the X-axis, and the first crystal grains collide against the second crystal grains at different points in time along the Y-axis,
   the light with which the amorphous semiconductor is irradiated, exhibits an intensity distribution varying in V shape along the X-axis and having a gradient of cyclic increases and decreases along the Y-axis, and is formed by a light modulating element, and
   the light modulating element has a basic pattern in which elongate band-like areas containing a plurality of unit areas arranged along the Y-axis and extending along the Y-axis are repeatedly arranged along the X-axis, and in each of the band-like areas, a ratio of the first area having the first phase value to the second area having the second phase value varies with the unit area along the X-axis, and a change rate of an occupied area rate of the first area in each unit area increases and decreases in the Y-axis for each band-like area.

7. A method of manufacturing a thin-film semiconductor device, comprising:
   forming an amorphous semiconductor film on an insulating substrate;
   irradiating the amorphous semiconductor film with light to convert the amorphous semiconductor into a polycrystalline semiconductor with laterally grown crystal grains to form a polycrystalline semiconductor film
   such that, on an X-axis and a Y-axis which are set with respect to a surface of the amorphous semiconductor film and which are orthogonal to each other, first crystal grains laterally grow in a first direction along the X-axis from a first group of initial nuclei on a first straight line extending along the Y-axis, second crystal grains laterally grow in a second direction opposite to the first direction along the X-axis from a second group of initial nuclei arranged on a second straight line extending along the Y-axis and apart from the first group of initial nuclei along the X-axis and the first straight line, the first crystal grains collide against the second crystal grains at different points in time along the Y-axis, and growing speeds of the first crystal grains and the second crystal grains vary between predetermined points along the Y-axis; and
   forming a plurality of thin-film transistors each having the polycrystalline semiconductor film as an active layer.

8. The method according to claim 7, wherein controlling the crystal growth in the amorphous semiconductor film such that the first crystal grains collide against the second crystal grains at the different points in time along the Y-axis is performed by controlling the crystal growth such that the first crystal grains laterally grow in the first direction along the X-axis from the first group of initial nuclei arranged at positions in the X-axis direction which vary along the Y-axis, and the second crystal grains laterally grow in the second direction opposite to the first direction from the second group of initial nuclei.

9. The method according to claim 7, wherein the first crystal grains and the second crystal grains grow laterally along the X-axis and collide against one another, and after the collision, the crystal growth in an area in which the collision occurs earlier than in an adjacent area along the Y-axis progresses to the adjacent area along the Y-axis in which the crystal growth has not started yet, and a plurality of isolated dot-like nodules are finally formed.

10. The method according to claim 9, wherein the forming the plurality of thin-film transistors each having the polycrystalline semiconductor film as the active layer includes patterning the polycrystalline semiconductor film to form a plurality of island-like polycrystalline semiconductor films, and forming the thin-film transistor on each of the plurality of island-like polycrystalline semiconductor films.

11. The method according to claim 7, wherein light with which the amorphous semiconductor is irradiated, exhibits an intensity distribution varying in V shape along the X-axis and having a gradient increasing and decreasing along the Y-axis.

12. The method according to claim 11, wherein the light exhibiting the intensity distribution varying in V shape along the X-axis and having the gradient increasing and decreasing along the Y-axis is formed by a light modulating element.

13. A method of manufacturing a thin-film semiconductor device, comprising:
   forming an amorphous semiconductor film on an insulating substrate;
   irradiating the amorphous semiconductor film with light to convert the amorphous semiconductor into a polycrystalline semiconductor with laterally grown crystal grains to form a polycrystalline semiconductor film such that, on an X-axis and a Y-axis which are set with respect to a surface of the amorphous semiconductor film and which are orthogonal to each other, first crystal grains laterally grow in a first direction along the X-axis from a first group of initial nuclei, second crystal grains laterally grow in a second direction opposite to the first direction along the X-axis from a second group of initial nuclei arranged apart from the first group of initial nuclei along the X-axis, and the first crystal grains collide against the second crystal grains at different points in time along the Y-axis; and
   forming a plurality of thin-film transistors each having the polycrystalline semiconductor film as an active layer, wherein
   the light with which the amorphous semiconductor is irradiated, exhibits an intensity distribution varying in V shape along the X-axis and having a gradient that increases and decreases along the Y-axis, and is formed by a light modulating element, and the light modulating element has a basic pattern in which elongate band-like areas containing a plurality of unit areas arranged along the Y-axis and extending along the Y-axis are repeatedly arranged along the X-axis, and in each of the band-like areas, a ratio of the first area having the first phase value to the second area having the second phase value varies with the unit area along the X-axis, and a change rate of an occupied area rate of the first area in each unit area increases and decreases in the Y-axis for each band-like area.

14. A method of manufacturing a thin-film semiconductor device, comprising:

forming an amorphous semiconductor film on an insulating substrate;

irradiating the amorphous semiconductor film with light to convert the amorphous semiconductor into a polycrystalline semiconductor with laterally grown crystal grains to form a polycrystalline semiconductor film such that, on an X-axis and a Y-axis which are set with respect to a surface of the amorphous semiconductor film and which are orthogonal to each other, first crystal grains laterally grow in a first direction along the X-axis from a first group of initial nuclei, second crystal grains laterally grow in a second direction opposite to the first direction along the X-axis from a second group of initial nuclei arranged apart from the first group of initial nuclei along the X-axis, and the first crystal grains collide against the second crystal grains at different points in time along the Y-axis; and forming a plurality of thin-film transistors each having the polycrystalline semiconductor film as an active layer, wherein the first crystal grains and the second crystal grains grow laterally along the X-axis and collide against one another, and after the collision, the crystal growth in an area in which the collision occurs earlier than in an adjacent area along the Y-axis progresses to the adjacent area along the Y-axis in which the crystal growth has not started yet, and a plurality of isolated dot-like nodules are finally formed, and wherein a sum of size $\phi$ of each of the dot-like nodules and an interval S between the adjacent dot-like projections is smaller than a minimum design rule Dm between the plurality of thin-film transistors.

* * * * *